United States Patent [19]

Tateishi et al.

[11] 4,348,276

[45] Sep. 7, 1982

[54] AUTOMATIC TESTING APPARATUS FOR AUTOMATICALLY TESTING A PRINTED CIRCUIT BOARD

[75] Inventors: Kazushi Tateishi, Kamisatomachi; Kuniaki Anzai, Kumagaya; Taketoshi Tomita, Chichibu, all of Japan

[73] Assignee: Tokyo Shibaura Denki Kabushiki Kaisha, Kawasaki, Japan

[21] Appl. No.: 224,282

[22] PCT Filed: Jun. 30, 1979

[86] PCT No.: PCT/JP79/00173

§ 371 Date: Jan. 8, 1981

§ 102(e) Date: Sep. 3, 1980

[87] PCT Pub. No.: WO80/02461

PCT Pub. Date: Nov. 13, 1980

[30] Foreign Application Priority Data

| May 8, 1979 | [JP] | Japan | 54-55851 |
| May 8, 1979 | [JP] | Japan | 54-55852 |
| May 8, 1979 | [JP] | Japan | 54-55853 |
| May 8, 1979 | [JP] | Japan | 54-55854 |
| May 8, 1979 | [JP] | Japan | 54-55855 |
| May 8, 1979 | [JP] | Japan | 54-55856 |
| May 11, 1979 | [JP] | Japan | 54-57817 |
| May 11, 1979 | [JP] | Japan | 54-57818 |
| May 11, 1979 | [JP] | Japan | 54-57821 |

[51] Int. Cl.$^3$ ............................................. B07C 5/344
[52] U.S. Cl. ................................... 209/573; 209/933
[58] Field of Search .............. 209/573, 574, 567, 568, 209/570; 324/158 T, 158 D, 73 R

[56] References Cited

U.S. PATENT DOCUMENTS

| 3,472,376 | 10/1969 | Broderick et al. | 209/573 X |
| 3,896,935 | 7/1975 | Hjelle | 209/573 |
| 4,128,174 | 12/1978 | Frisbie et al. | 209/573 |
| 4,234,418 | 11/1980 | Boissicat | 209/573 X |

Primary Examiner—Allen N. Knowles
Attorney, Agent, or Firm—Cushman, Darby & Cushman

[57] ABSTRACT

A printed circuit board (OS) with a circuit for use in a television receiver is carried to a location of a conveyor (OD) for testing process. A printed circuit board take-out device (OB), automatic parts testing device (OF), first sorting device (OG), first automatic parts measuring/adjustment device (OI), second sorting device (OJ), second automatic parts measuring/adjustment device (OK), third sorting device (OL) etc. are sequentially arranged on a path of conveyance of the printed circuit board on the conveyor (OD). The automatic parts testing device (OF) is adapted to test whether or not a component part of a desired value exists in a desired location of the printed circuit board (OS). The first sorting device (OG) is adapted to transfer an unfit printed circuit board to a conveyor (OH) for unfit printed circuit board. The first automatic parts measuring/adjustment device (OI) is adapted to primarily measure the output of the receiving system of a television circuit, while adjusting a to-be-adjusted component part through a driver device so that it has a proper circuit characteristic. The third sorting device is adapted to eventually transfer the printed circuit board to a guide device for fit printed circuit board if it is fit and to the conveyor (OH) if it is unfit.

3 Claims, 29 Drawing Figures

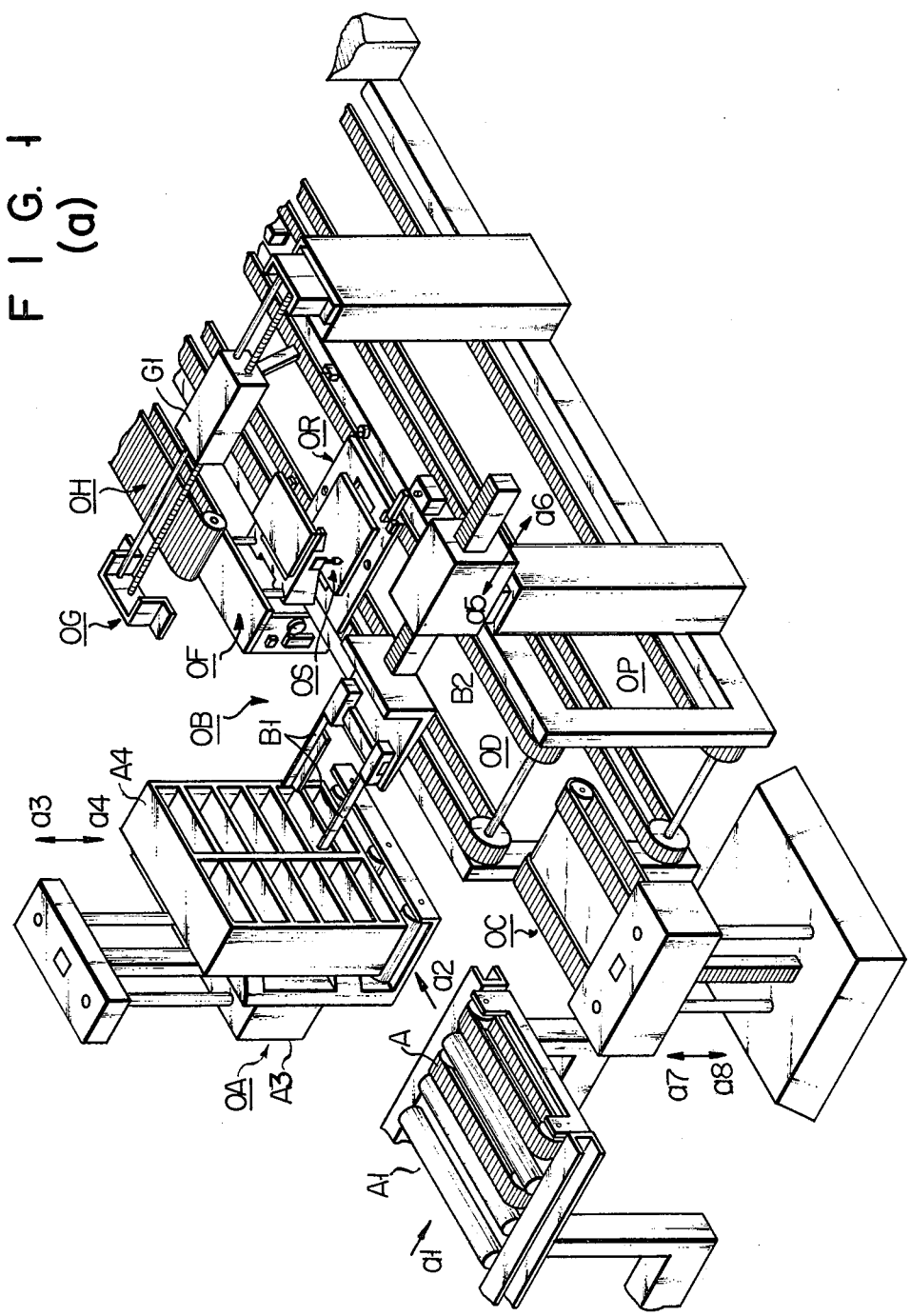

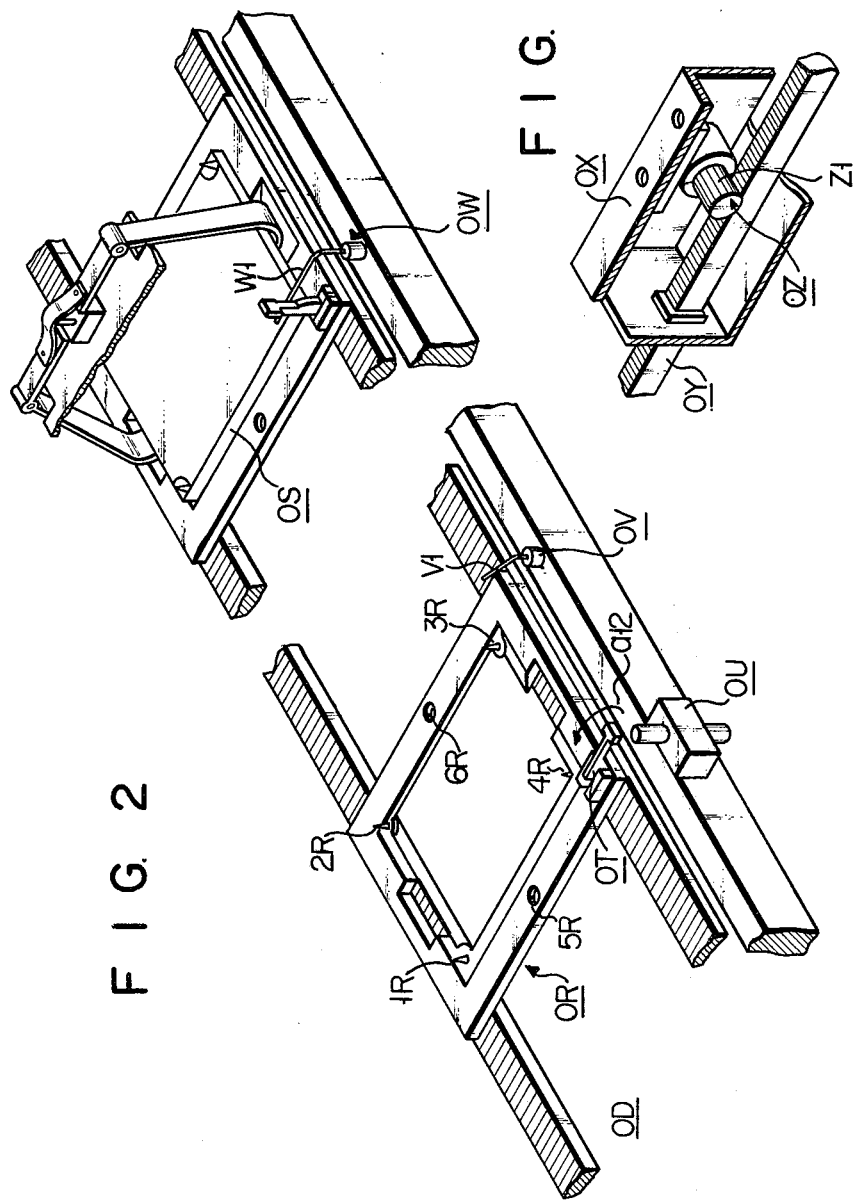

F I G. 16
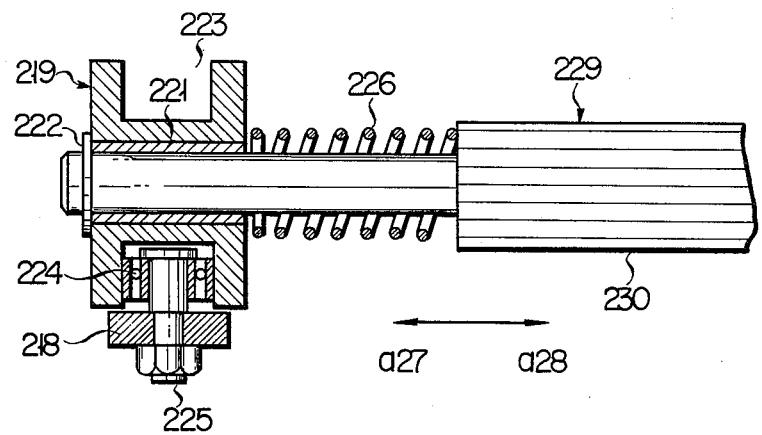
F I G. 17
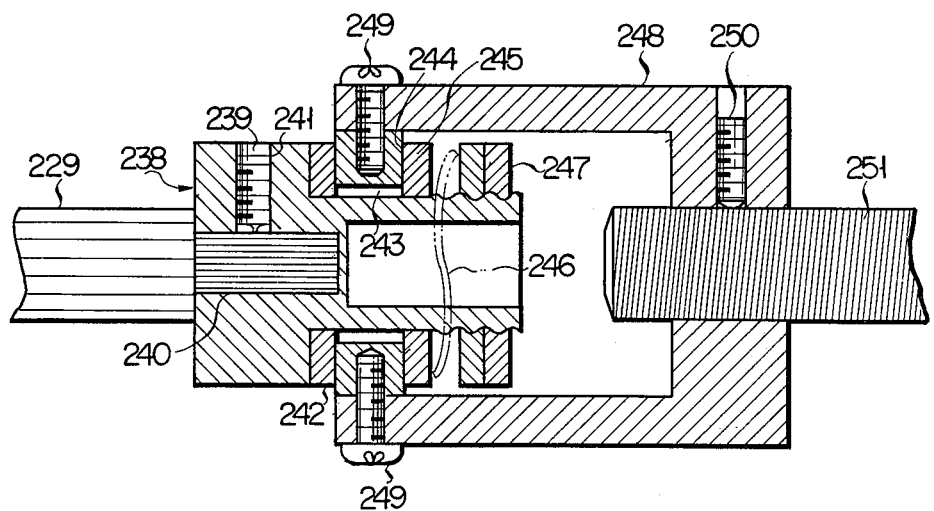

F I G. 18
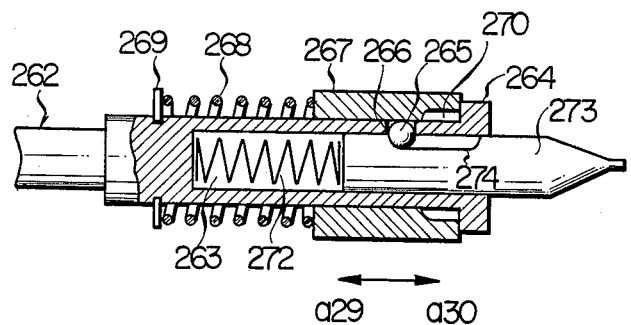
F I G. 19
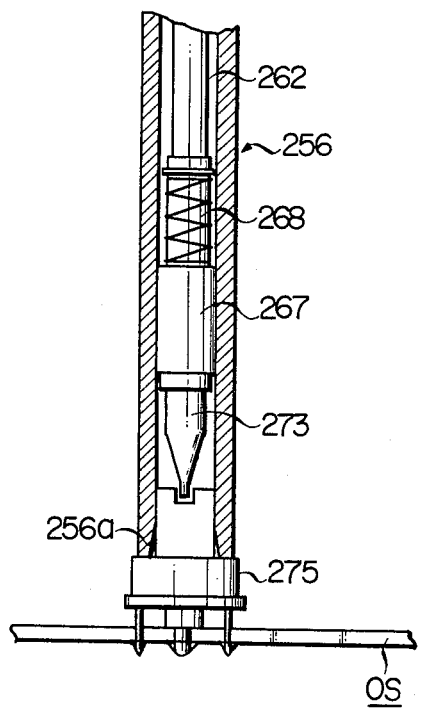

F I G. 23
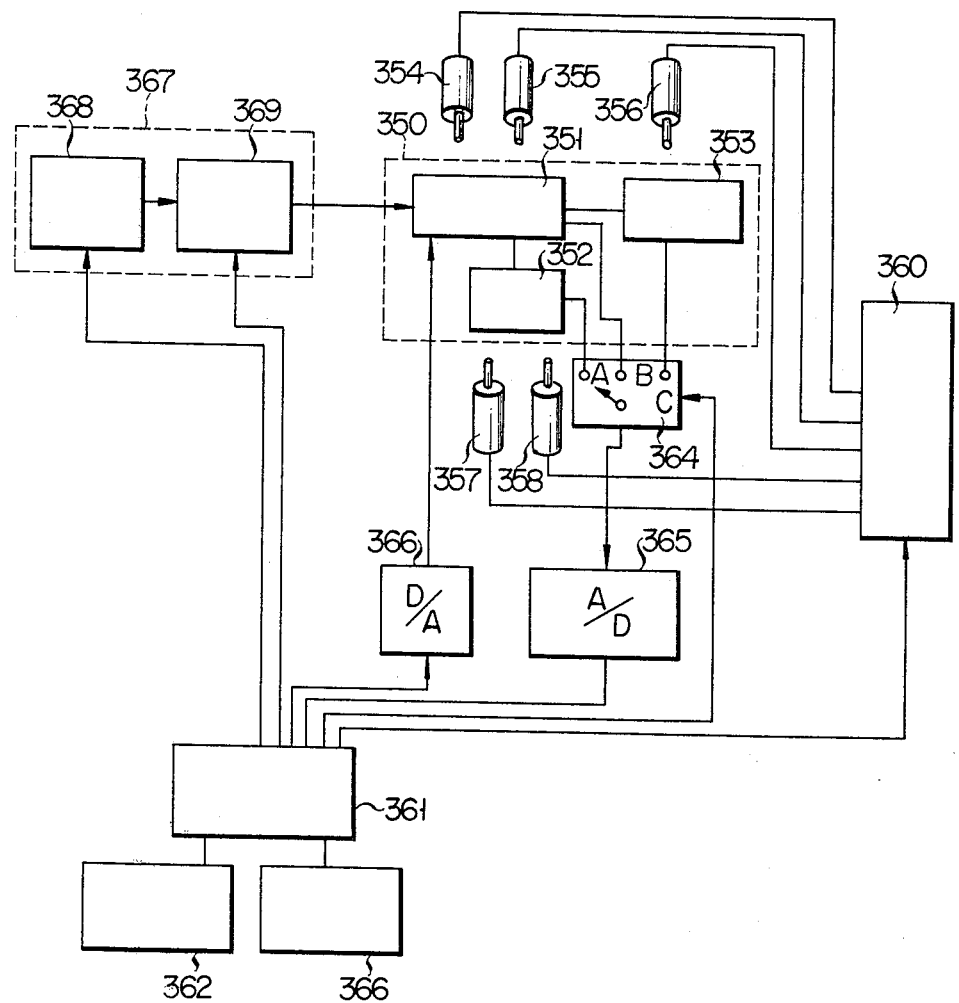

F I G. 24
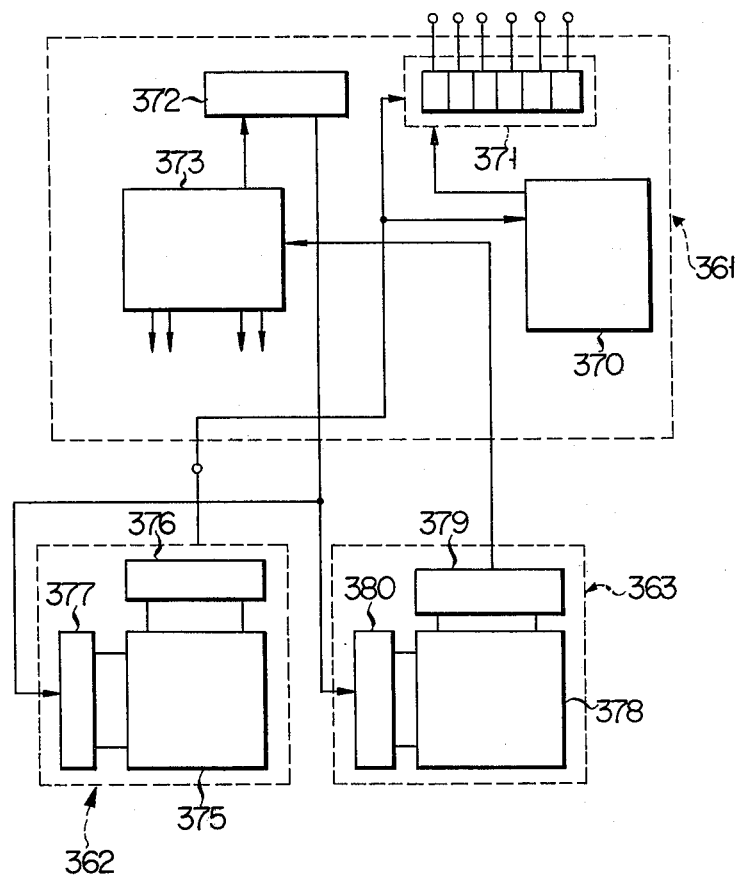

AUTOMATIC TESTING APPARATUS FOR AUTOMATICALLY TESTING A PRINTED CIRCUIT BOARD

TECHNICAL FIELD

This invention relates to an automatic testing apparatus for testing a printed circuit board of a television receiver etc. by a sequence of checking and adjustment steps.

BACKGROUND ART

Miniature component parts are realized in the printed circuit board of a television receiver, and various functional blocks such as a receiving system circuit block and deflection system circuit block are integrated on a sheet of printed circuit board. If the printed circuit board is manually tested, there are chances of introducing an erroneous checking or adjustment. Such a testing is also time-consuming. For this reason, there is a growing demand for an automatic testing apparatus.

DISCLOSURE OF INVENTION

This invention provides an automatic testing apparatus for automatically testing a printed circuit board, which comprises a frame-like pallet OR for carring a printed circuit board; a pallet supply device OC for supplying the pallet OR to a conveyor OD for testing process; a printed circuit board takeout device OB for placing a printed circuit board OS to the pallet which is supplied to the conveyor OD; an automatic parts testing device OF disposed in a fixed position on a path of conveyance of the printed circuit board OS by the conveyor OD and having upper and lower arm tables 20, 31 movable such that the printed circuit board OS is sandwiched therebetween, the lower arm table 31 having a contact pin 38 adapted to be contacted with the corresponding component part terminal on the printed circuit board OS, said automatic parts testing device OF being capable of electrically checking the component part through the contact pin; an automatic parts measuring/adjustment means 01, OK disposed in a fixed position on a path of conveyance of the printed circuit board OS passed through the automatic parts testing device OF and having upper and lower arm tables 150, 161 moved such that the printed circuit board carried to this position is sandwitched therebetween the lower arm table 161 having a contact pin 168 adapted to be contacted with the terminal of each part of the printed circuit board OS and at least a driver device adapted to be fitted into a to-be-adjusted component part on the printed circuit board for driving, said automatic parts measuring/adjustment means being adapted to measure the circuit or component part through said contact pin, while adjusting the component part by said driver device 158; and sorting means OG, OJ, OL disposed in a fixed position on a path of conveyance of the printed circuit board by the conveyor OD to lift the printed circuit board OS to permit it to be transferred to a conveyor for unfit printed circuit board if it is at least unfit, whereby checking is made as to whether or not a desired component part is loacated in a desired position on the printed circuit board, automatic adjustment is made such that the intended circuit has a desired characteristic, and these operations can be effected by a sequence of steps to permit the rapid and smooth testing of the printed circuit board as well as the positive checking, adjustment etc.

BRIEF DESCRIPTION OF THE DRAWINGS

This invention will be further described below by way of example by reference to the accompanying drawings in which:

FIG. 2 is an explanatory view showing a board carrying pallet, pallet detection device, fit/unfit determining device and fit/unfit information pin as shown in FIG. 1;

FIG. 3 is an explanatory view showing one form of a drive means for a lifter, sorting device etc. of FIG. 1;

FIG. 16 is an explanatory view showing one form of an axial drive means of a driver device of FIG. 14;

FIG. 17 is an explanatory view showing one form of a clutch means of the driver device of FIG. 14;

FIG. 18 is an explanatory view showing one form of a tip replacement section of the driver device of FIG. 14;

FIG. 19 is an explanatory view showing a mating state between the forward end portion of the dirver device of FIG. 14 and a to-be-adjusted component part;

FIG. 23 is a block diagram showing one form of circuit as used in an electric system of FIG. 22;

FIG. 24 is a block diagram showing a control section of the block diagram of FIG. 23;

BEST MODE OF CARRYING OUT THE INVENTION

Figure 1B:
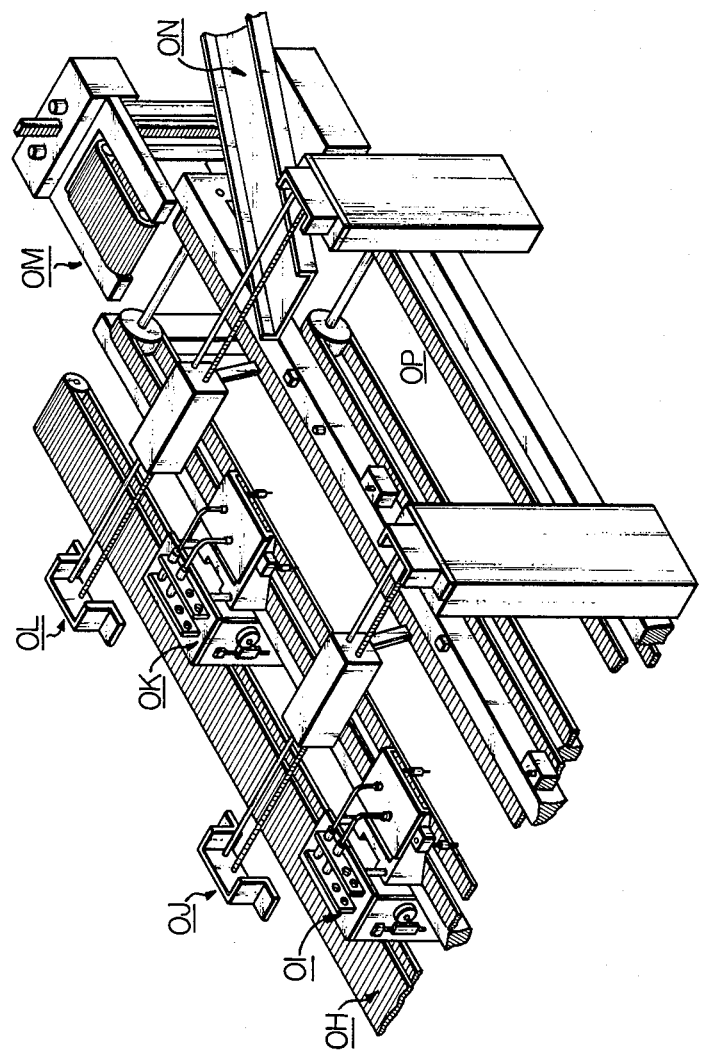
FIGS. 1(a) and (b) are schematic view generally showing the preceding and following stages of a printed circuit board automatic testing apparatus according to one embodiment of this invention.

The embodiment of this invention will be explained below by referring to the drawings.

FIGS. 1(a) and (b) generally show the preceding and following stages of an arrangement of a system of a printed circuit board. OA shows a printed circuit board introducing section for causing a parts-assembled/soldered printed circuit board to be carried to this site. Conveyors A1, A2 and lifter A3 are arranged in the printed circuit board introducing section OA. The conveyors A1, A2 etc. convey a casing A4 in which a plurality of printed circuit boards are arranged and held. The casing A4 is belt-conveyed in a direction of a1, a2 as indicated by arrows in FIG. 1 onto a base of the lifter A3. The lifter A3 can be adjusted such that it can be moved in a direction of a3←—→a4 as indicated by arrows.

OB is a circuit board takeout device which takes the circuit boards in the casing A4 one by one for supply to a conveyor OD for testing process. That is, the circuit board is sandwiched by arms B1 and taken out. An electromagnet is used as an arm drive means. As a means for driving in a direction of a5←—→a6 as indicated by arrows a worm gear is rotated by a motor disposed in a driving section B2.

The printed circuit board taken out by the abovementioned circuit board takeout device OB is placed on a board conveying pallet which is sent from a pallet supply device OC.

That is, the pallet supply device OC is equipped with a lifting device which is movable up and down in a direction of a7←—→a8 as indicated by arrows, and adapted to permit an empty pallet sent from a pallet return conveyor OP below the conveyor OD to be sent back to the conveyor OD.

The printed circuit board is placed by the board takeout device OB on the empty pallet. When the circuit board is placed on the pallet it is sent by the conveyor OD to the position of an automatic parts testing device OF.

The automatic part testing device OF is so constructed that it holds down the upper surface of the printed circuit board and permits a contact pin to be abutted, from below, against the terminal of a desired component part. With the contact pin abutted against the terminal of the desired component part the automatic parts testing device OF checks, by comparison by a microcomputers, whether or not the component part is an intended component part and has an intended value.

When the operation of the automatic parts testing device OF is completed the printed circuit board is sent to the location of an automatic parts measuring/adjustment device OI.

When it is found as a result of checking by the automatic parts testing device OF that the printed circuit board is defective, the circuit board is fed by a sorting device OG on the halfway to an unfit parts conveyor OH. In the sorting device OG a conveying section G1 is driven in a direction of a10←—→a11 as indicated by arrows. The conveying section G1 has a plurality of arms by which the unfit printed circuit board is grasped and the unfit circuit board is conveyed along a rail to the above-mentioned unfit parts conveyor OH.

The circuit board sent to the first automatic parts measuring/adjustment device OI has its desired component part contacted by the contact pin, and a driver device acts upon a variable capacity element, variable resistive element etc. The subject circuit has its variable element adjusted to obtain a desired characteristic. The circuit characteristic is converted through the contact pin to a data signal and compared with ideal data stored in a computer. Where a defference in excess of a predetermined value occurs between the data, adjustment is effected by the driver device so as to compensate for such difference.

When the measurements and adjustment by the first automatic parts measuring/adjustment device OI are completed, the printed circuit board and pallet are supplied to the location of a sorting device OJ. The sorting device, like the sorting device OG, can convey an unfit printed circuit board to an unfit circuit board conveyor OH. If the printed circuit board is fit, it passes through the sorting device OJ and is moved to the location of a second automatic parts measuring/adjustment device OK. The second automatic parts measuring/adjustment is operated such that the printed circuit board is sandwiched by a means similars to that of the first automatic parts measuring/adjustment device OI with a contact pin abutted against the terminal of the desired circuit, and adjusts the characteristic of the printed circuit board by a driver device. The second automatic parts measuring/adjustment device is different from the above-mentioned first automatic measuring/adjustment device OI in that a corresponding different circuit is measured and adjusted.

The circuit board bearing pallet which has passed through the automatic parts measuring/adjustment device OK is moved to the location of a third sorting device OL where fit and unfit circuit boards are sorted out. In this case, driving means are the same as that of the above-mentioned sorting device. It is to be noted that the sorting device OL transfers the unfit circuit board to the above-mentioned unfit circuit board conveyor OH and the fit circuit board to a fit circuit board guide device ON so that the pallet is emptied.

The empty pallet is transferred by the conveyor OD to a pallet receiving device OM. The pallet receiving device OM performs an operation opposed to that of the above-mentioned pallet supply device OC and permits the pallet received at the upper run to be transferred to the pallet return conveyor OP at the lower run.

In the above-mentioned system the following means are used to sort out the fit and unfit articles.

In FIG. 2, OR shows a circuit board carrying pallet having a picture frame-like configuration. A fit/unfit information pin OT is attached to one corner of the upper surface of the pallet. Projecting pins 1R, 2R, 3R, 4R are provided one at each of four corners of the pallets to position a printed circuit board OS. The printed circuit board OS has holes corresponding to pins 1R, 2R, 3R, 4R. A circuit board currying pallet OR has positioning holes 5R, 6R at the opposite sides thereof in a direction perpendicular to the conveying direction to position the pallet when it is moved to the testing location of the automatic parts measuring/adjustment device and measuring/adjustment location of the automatic parts measuring/adjustment device. When the pallet OR is conveyed to the conveyor OD, each conveying position is ascertained by a pallet sensing device OV. The device OV has a projecting sensing needle V1 on a path of movement of the pallet and produces an electrical pallet sensing signal upon the sensing needle V1 being depressed.

When the pallet sensing signal is obtained, the automatic parts testing device, automatic parts measuring/adjustment device etc. at that position start their operation under the control of a computer. If as a result of testing or adjustment, the circuit board on the pallet is found to be unfit, a fit/unfit determing device OU raises the fit/unfit information pin OT before the circuit board is moved to the next step. The fit/unfit information pin OT is mounted on the pallet such that when it is pushed upward in excess of a suitable angle it is elastically swingably urged in a direction of a12 as indicated by an arrow.

When the pallet is sent to the location of the sorting device OG or OJ, OL with the fit/unfit information pin OT raised, the raised state of the pin is sensed by a pin information sensing device OW. The device OW has a projecting sensing needle W1 on a track on which the pallet is passed with the pin raised, and produces an electrical, sorting start signal when the sensing needle W1 is depressed. By the sorting start signal the sorting device starts its operation and transfers the printed circuit board OS to the conveyor OH.

FIG. 3 shows a driving means such as the sorting device and lifter. A casing OX is supported such that it can be moved along a rail OY. A motor OZ is mounted within the casing OX and a gear Z1 rotated by the motor OZ is designed to be intermeshed with the serrated surface of the rail OY. By controlling the normal or reverse rotation of the motor OZ the casing OX can be moved in either direction along the rail.

The apparatus of this invention is constructed as mentioned above. Explanation will be made in more detail of each device of the apparatus.

Figure 4:
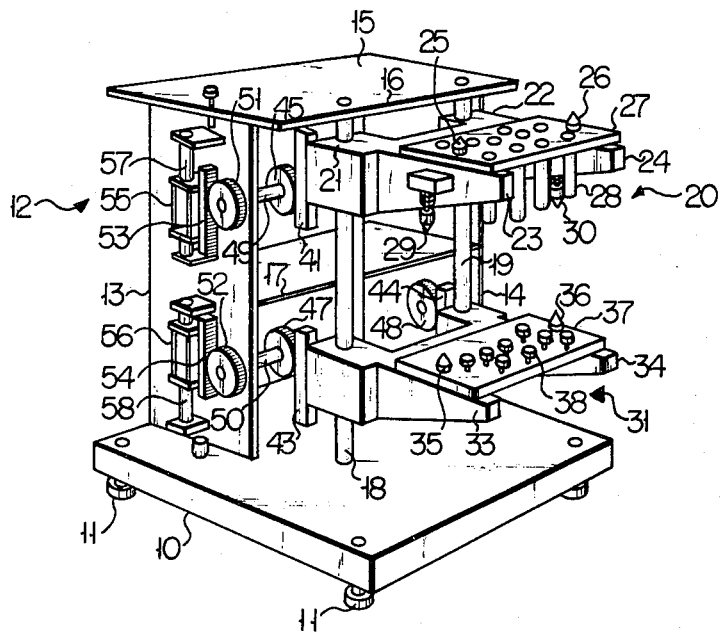
FIG. 4 is a schematic view showing an automatic parts testing device of FIG. 1.
Figure 5:
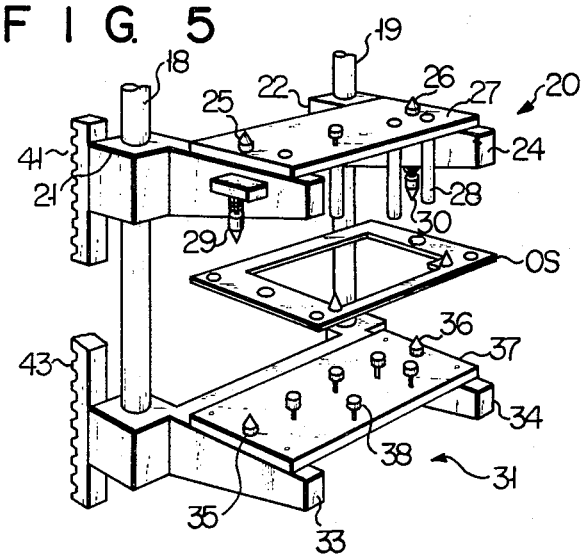
FIG. 5 is an explanatory view showing a table arm section of the automatic parts testing device of FIG. 4.
Figure 6:
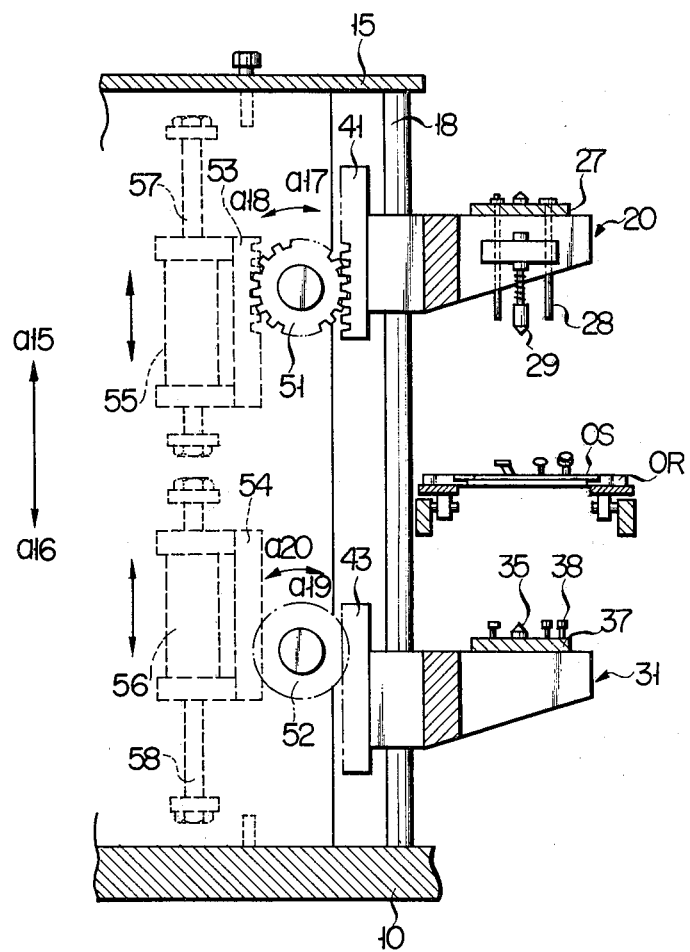
FIG. 6 is a cross-sectional view for explaining the operation of the automatic parts testing device of FIG. 4.
Figure 10:
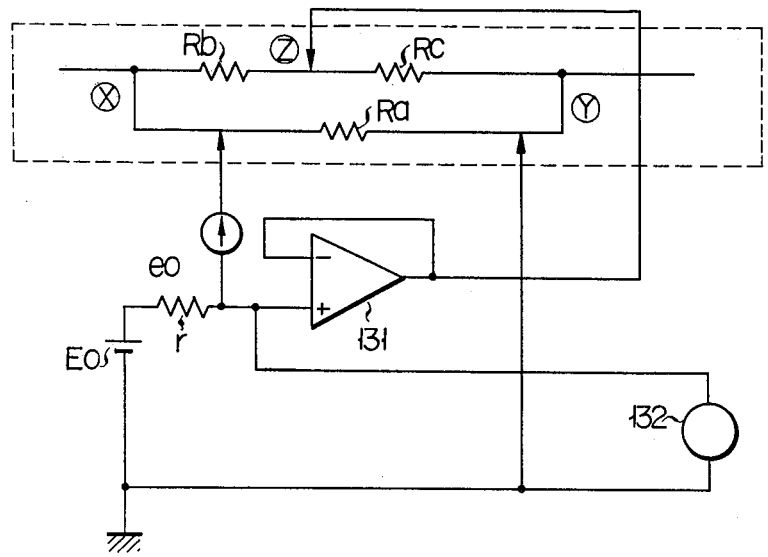

In FIGS. 4 and 5, 10 shows a base having a plurality of base adjusting means 11 capable of horizontal tilt adjustment and height adjustment. A device casing 12 is provided on the upper portion of the base 10. The casing 12 has mutually parallel side plates 13, 14 vertically disposed on the base 10, a top plate 15 spanned between the side plates 13, 14, and a support plate 17 disposed between the top plate 15 and the base 10 and parallel to the base plate 10.

First and second guide shafts 18 and 19 are mounted between one side 16 of the top plate 15 and the base 10 such that they are arranged side by side on said one side of the top plate 15. An upper arm table 20 is mounted on the first and second guide shafts 18, 19 that it can be moved and extends in the horizontal direction. The arm table 20 has, for example, a substantially H-shape in the plan view and a pair of legs 21, 22 of the base end portion of the arm table has holes of such a size as to permit the first and second guide shafts 18, 19 to extend therethrough. By so doing, the arm table 20 is horizontally supported. Arms 23, 24 of the forward end side of the arm table 20 extend away from the casing, and a pallet 27 for hold-down rods which is formed of a transparent synthetic resin plate is spanned between the arms 23 and 24 utilizing mounting screw means 25, 26. The pallet 27 has a plurality of through holes and a hold-down rod 28 for holding down the circuit board is mounted by a mounting screw etc. in the desired through hole of the pallet so that it can extend downward. The rod 28 has its forward main portion formed of an insulating synthetic resin having, for example, resilience. Positioning pins 29, 30 are projected downward to accurately position the circuit board bearing pallet being moved under the arms. The positioning pins 29, 30 have a forward tapering head which is elastically urged downward by, for example, a spring.

A lower arm table 31 is mounted on the first and second guide shafts 18, 19 in the same way as the upper arm table 20. A pallet 37 for contact pins which is formed of a transparent synthetic resin is spanned between arms 33, 34 of the table 31 utilizing mounting screw means 35, 36. The pallet 37 has a plurality of through holes, and a contact pin 38 for checking the component part is mounted by a screw etc. in the desired through hole such that it can be projected upward.

Racks 41, 42 and 43, 44 are fixed on the ends of the legs of the arm tables 20, 31 such that they extend in the same direction as the guide shafts etc. (the rack 42 is not shown). The serrated surface of the racks 41, 42 and 43, 44 are intermeshed with pinions 45, 46 and 47, 48 (the pinion 46 is not shown), respectively, and when the respective pinions are rotated the arm tables 20 and 31 can be moved toward, or away from, each other.

The pinions 45, 46, 47, 48 are each fixed on the corresponding rotation shaft which externally extends through the side plate (13, 14) of the casing. As the pinions 45, 47, rotation shafts 49, 50 are shown in FIG. 4, they will be explained below. Rotation shafts 49, 50 for the pinions 45, 47 permit pinions 51, 52 to be fixed, through the latter are located outside of the side plate 13. The pinions 51, 52 are intermeshed with racks 53, 54. The racks 53, 54 are formed integral with a double acting type air cylinders 55, 56. Shafts 57, 58 of the air cylinders 55, 56 are fixed to the mounting portions of the side plate 13. As a result, the bodies of the air cylinders 55, 56 can be axially moved up and down. In this case, the racks 53, 54 can rotate the pinions 51, 52.

The automatic parts testing device OF so constructed is operated as follows. That is, when the upper air cylinder 55 is moved in a direction of a15 the pinion located outside of the side plate 51 is rotated by the rack 53 and the inside pinion 45 is rotated in a direction of a17 as indicated by an arrow. By so doing, the upper arm table 20 is moved down in a direction of a16 as indicated by an arrow to cause the printed circuit board OS to be held down by the hold-down rod 28. The rod 28 is set such that it holds down the circuit board, while it passes through a spacing between the component parts on the printed circuit board.

The lower air cylinder 56, is driven in a direction of a20 as indicated by the arrow. By so doing, the pinion 52 is rotated in a direction of a20 as indicated by arrows to cause the lower arm table 31 to be moved in the direction of a15 to cause the contact pin 38 to be contacted with the soldered terminal of a desired component part. In this case, a cushion mechanism for providing cushion in the direction of a15 a16 is provided in the contact pin 38 to permit all the contact pins to be contacted with the desired terminals irrespective of the length of the soldered terminals. With the contact pin 38 in contact with the terminal the respective component parts are automatically checked. If in this case the component part is, for example, a resistor, a predetermined voltage is applied through the contact pin to the resistor and checking is effected as to whether or not a predetermined value is obtained as a voltage drop. Since many various component parts are involved as parts to be checked, a checking process is effected by a microcomputer as shown, for example, in FIG. 7. Upon completion of checking, the air cylinder, pinion etc. are returned to the original position and the arm table is also returned to the original position in readiness for the next checking operation. It is to be noted that screws 53₁, 54₁ are stoppers for regulating the positions of the racks 53, 54.

Figure 7:
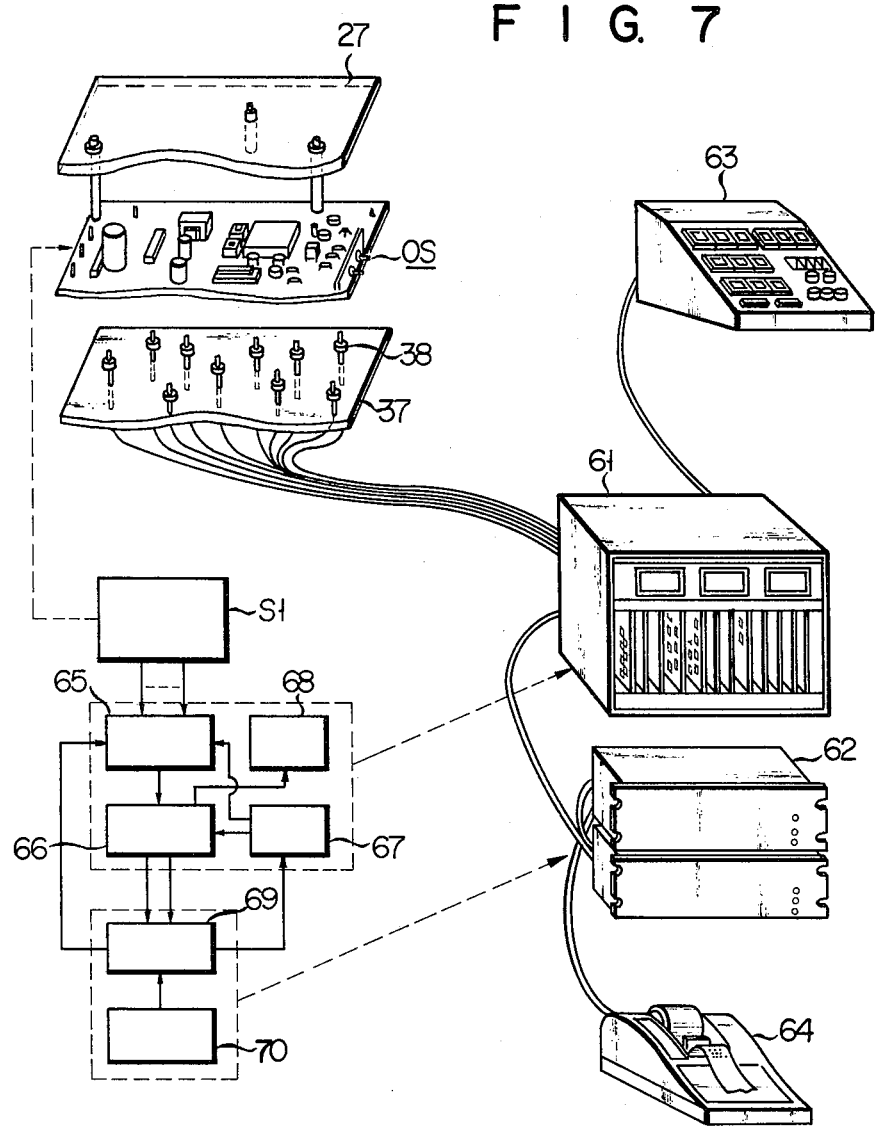
FIG. 7 is an explanatory view showing an electrical test system as used in the automatic parts testing device of FIG. 4.

FIG. 7 shows the parts testing system. 61 shows an interface unit and 62 shows a control judjing unit including a calculation processing unit. 63 shows an operator console unit and where, for example, only a certain component part is rechecked or the testing of a certain component part is omitted a parts code corresponding to the certain component part is inputted to the operator console unit. 64 shows a digital printing unit which prints out the tested parts code, a result of testing or an unfit article code.

The printed circuit board OS provides a circuit unit S1 to be tested and the contact pin 38 is connected to a switching section 65 including a contact element switching function of the interface unit 61. The switching section 65 is controlled by a control signal from a process input/output unit 69 of the control judging device 62 to cause the contact pin contacted with a to-be-tested component part to conduct. The output of the switching section 65 of the interface unit 61 is inputted to a signal processing circuit 66 in this device. The signal processing circuit 66 includes a rectifying means, calculation means, decoding means etc. and the output of the circuit 66 is applied to a display section 68 for display, and through the input/output control circuit 69 to a control judging circuit 70 so that its value is judged for fitness.

The interface unit 61 also includes a constant voltage generator 67 and generates a predetermined voltage based on data from the circuit 70, so that it is supplied to the switching section 65, signal processing circuit 66 etc.

By such parts testing system the circuit components of the printed circuit board is checked and judged for fitness.

One form of the parts testing circuit will be explained below by referring to FIG. 8.

Figure 8:
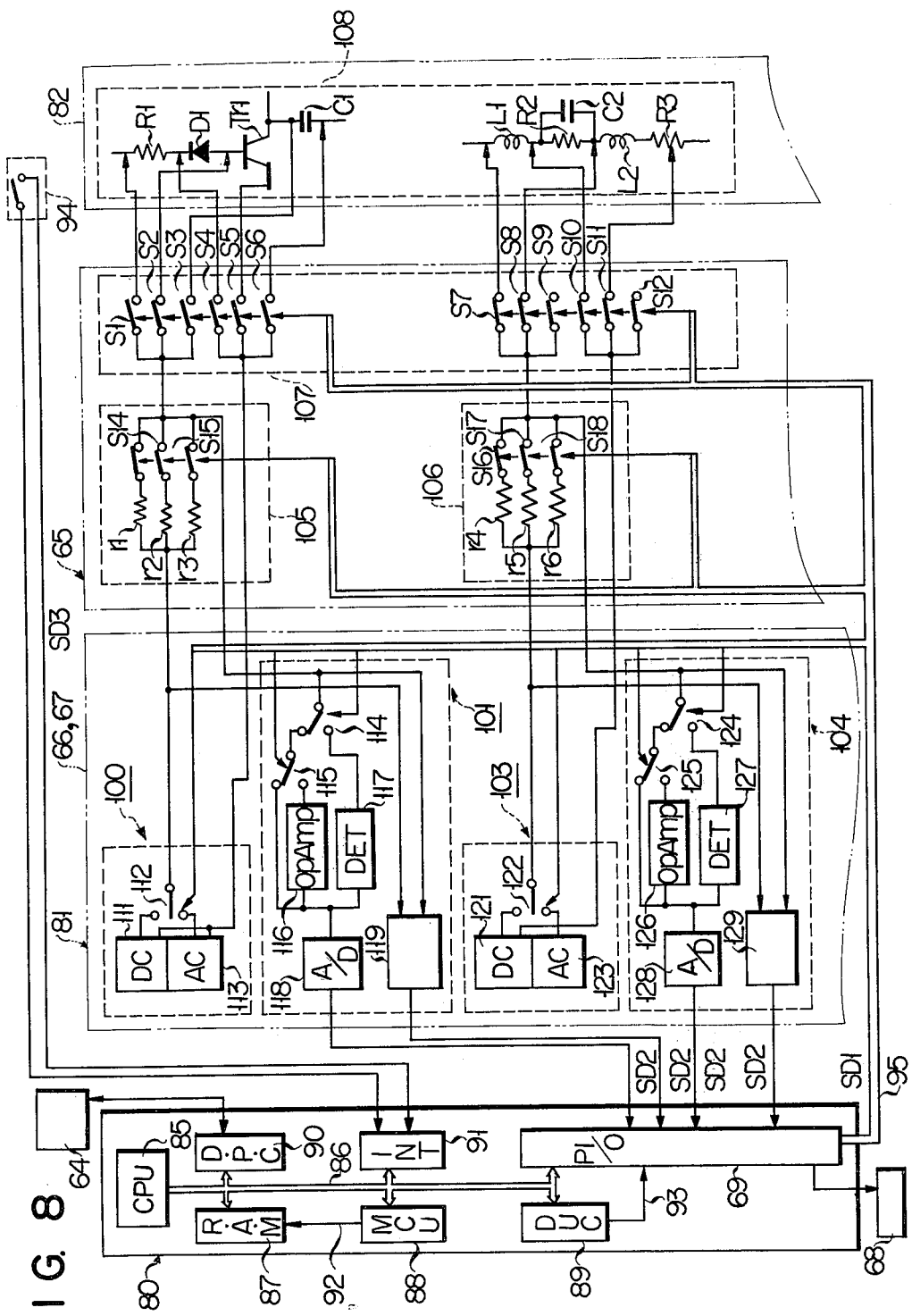
FIG. 8 is a circuit diagram as used in the testing system of FIG. 7.

In FIG. 8, 80 shows a calculation processing unit; 81, a test signal unit; and 82, a unit rest section. Said calculation processing unit 80 has a central calculation processing unit 85 (hereinafter referred to as cpu). Through a common bus line 86, cpu 85 is connected to a random access memory 87 (hereinafter referred to as RAM), memory control unit 88, device control unit 89, digital printer control unit 90, interrupt processing unit 91, process input/output device 69 etc. The memory control unit 88 is connected by an address designating signal line 92 to RAM 87 and the device control unit 89 is connected by an input/output select signal line 93 to the process input/output device 69.

The digital printer control unit 90 is connected to a printer 64 and the interrupt processing unit 91 is also connected to a measuring start signal generating section 94. A display signal line of the process input/output unit 69 is connected to a display 68.

Data on a switching signal output line 95 of the process input/output unit 69 is inputted to the control terminal of signal generators 100, 104 etc. in the test signal section 81 and data on the switching signal line 95 is inputted to the control terminal of standard resistor switching circuits 105, 106 etc. in the switching section 65. Data on the switching signal output line 95 is inputted to the control terminal of an analog multiplexer section 107 in the switching section 65.

Signals from the signal generators 100, 103 etc. in the test signal section 81 are inputted to the corresponding standard resistor circuits 105, 106 etc. Outputs of the standard resistor switching circuits 105, 106 etc. are inputted to said analog multiplexer section 107. The output of the analog multiplexer section 107 is inputted to a desired terminal in the unit 108 through a contact pin which is selected based on the data on the switching signal line 95. The analog multiplexer section 107 is controlled by data on the switching signal line 95. When a signal is supplied across, the terminal selected by the analog muliplexer section 107, a voltage or current across the resistor in the standard resistor switching circuit 105, 106 etc. varies according to the element to which the signal is supplied. In consequence, the sense output signals of the respective standard resistor switching circuits 105, 106 etc. are inputted to the corresponding signal processing circuits 101, 104 etc. in said test signal section 81. The signal processing circuits 101, 104 etc. convert an analog signal inputted by the above-mentioned measuring operation to a digital signal and deliver it as a judge data to the process input/output unit 69. When the machine explained in connection with FIG. 1 holds the printed circuit board in place, a start signal is obtained from the measuring start signal generating section 94. An interrupt processing unit 91 supplied with a start signal checks the interrupt contents through the common bus line 86. When the interrupt contents determined, cpu 85 issues an instruction for delivering data (software program) stored in RAM 87 to the memory control unit 88, so as to go ahead with the next procedure. The memory control unit 88 decodes the instruction from cpu 85 and supplies an instruction to the address designating signal line 92 for delivering data in correct order to the common bus line 86. cpu 85 reads this data so as to proceed with the next procedure. Where cpu 85 issues a signal to the test signal section 81 and switching section 65, cpu 85 instructs the process input/output device 69 through the common bus line 86 to produce an output select signal SDI.

The process input/output unit 69 judges by a signal sent over the common bus line 86 from cpu 85, whether an input signal or an output signal is present. A (input-/output mode judging) digital printer control unit 90 receives a signal from the process input/output unit 69 and the content of RAM 87 under the control of cpu 85 and delivers a signal to the external printer 64. Where judge data SD2 is received, cpu 85 can check the signal sent from the process input/output device 69 over the common bus line 86. In this way, the calculation processing section 80 controls the unit according to the procedure.

The function and operation of the test signal section 81 will be explained below.

The signal generators 100, 103 are circuit portions for generating a signal for applying a test signal to the unit 108. The signal generators 100, 103 include a lower voltage DC power supply 111 and lower voltage AC power supply 113 and these are arbitrarily selected by a program. Where, for example, a resistive element, diode, transistor etc. in the unit 108 are measured, the lower voltage DC power supply 111 is selected. Where a coil or a capacitor is measured, the lower voltage AC power supply 113 is selected by a program. The lower voltage DC power supply 111 and lower voltage AC power supply 113 are switchingly selected by the signal switching signal SD1 from the calculation processing section 80. The signal processing sections 101, 104 etc. include an analog/digital converter, phase meter, operational amplifier etc. The analog/digital converters 118, 128 etc. read a variation of a signal which is introduced through a to-be-measured circuit network. The converters 118, 128 read such a signal variation directly or through the operational amplifiers 116, 126 when the signal source is a DC power supply, and through the rectifiers 117, 127 when the signal source is an AC power supply. The phase meters 119, 129 are operated if only the AC power supply is selected, and detects a phase difference of a signal which is applied to a to-be-measured circuit or part. The analog/digital converter and phase meter send the readout data as a judge date to the calculation processing section.

The standard resistor switching sections 105, 106 etc. in the switching section 65 selects an optional standard resistor for a to-be-measured component part in the to-be-measured circuit board. The switching operation for the standard resistor is effected by the standard resistor switching signal SD1 from the calculation processing section 80. The analog multiplexer section 107 supplies signals from the signal generators 100, 103 through the standard resistors to the to-be-measured component parts in the to-be-tested unit, while through the contact pin. For this reason, the switching signal SD1 applied to the analog multiplexer section 107 is utilized as a signal for selecting a to-be-measured component part.

The unit rest section 82 has, for example, a jig for supporting a to-be-tested unit 108, a contactor for applying a signal directly to a predetermined component part. Explanation will be made in more detail of a method for measuring a resistor, diode, capacitor, coil etc.

When the to-be-tested unit 108 is placed correctly on the unit rest section 82, a measuring start signal SD3 is automatically inputted to the interrupt processing unit 91 in the calculation processing section 80 and measuring is started according to the program.

When a resistor R1 in the unit 108 is to be measured, a switch 112 in the signal generator 100, for example, is controlled and switching is effected to the lower voltage DC power supply 111. Any one of switches S13, S14, S15 is rendered ON by the switching signal and one of standard resistors r1 to r3 is selected. Then, switches S1 and S4 in the multiplexer section 108 are rendered ON by a switching signal. By this operation a test signal is applied to the resistor R1.

In order to detect a DC voltage on a voltage dividing point between the standard resistor r1 and the resistor R1, switches 114 and 115 are controlled by a switching signal to permit an input signal to be introduced directly into the analog/digital converter 118. Judge data read by the analog/digital converter 118 is sent to the process input/output unit 69 and the judge data is calculated by cpu 85 for judgement as to its fitness. The measuring of the diode D1 or the transistor Tr1 is effected in the same procedure as that of said resistor R1. The constant of R1 is calculated by $$R1 = \frac{Ex}{ES - Ex} \times r$$

where
EX: a voltage across the resistor R1
Es: a reference DC power supply voltage
r: a reference resistor r Comparison is effected between the constant value of R1 and a reference value beforehand stored in RAM 87 and the result of judging is obtained in connection with its fitness.

The measuring of a capacitor C1 will be explained below. The lower voltage AC power supply 113 in the signal generator 100 is used in the measurement of the capacitor. By using this, an original waveform and a voltage waveform phase-shifted by a to-be-tested capacitor C1 are detected from a point connected through the reference resistor and its variation is read by the phase meter 119. The phase meter 119 has the function of forming judge data as an output and supplies judge data to the process input/output unit 69. The judge data is judged by cpu 85 for its fitness, in the same way as that of the abovementioned resistor R1. With respect to the coils L1, L2 etc., an AC power supply, phase meter etc. are used in the same procedure.

In the case of the capacitor, the constant of C1 is calculated by $$C1 = \frac{1}{Ws \cdot r} \times \tan \theta$$

where
$\theta$: judge data of the phase meter which is sent to cpu 85 through the process input/output unit 69
Ws: a reference AC power supply
r: a reference resistor In the case of a coil, the constant of L1 is calculated by $$L1 = \frac{r}{Ws} \times \cos \theta$$

For a parallel connection of a resistor R2 and capacitor C2 and a series connection of a coil L2 and resistor R2, switching is effected so that a phase difference is measured by the phase meter while analog/digital conversion is effected by the analog/digital converter 118 connected to the rectifier 117. The AC power supply 113 is used as a power supply. The measured values from the analog/digital converter 118 and phase meter 119 are sent as judge data to the process input/output unit. Their judge data are calculated by cpu 85 and two component parts in such parallel or series connection are judged for their fitness.

In the case of a parallel connection of a resistor and capacitor, for example, R2 and C2 their value can be simultaneously calculated by $$R2 = \frac{K \cdot r}{\cos\theta - K}, \quad C2 = \frac{R2 + r}{Ws \cdot R2 \cdot r} \times \tan \theta$$

where
K: data on the amplitude value
$\theta$: judge data on the phase difference
Ws: the reference AC power supply
r: the reference resistor As a result, the measuring efficiency is good.

For a series connection of, for example, a coil L2 and resistor R3, $$R3 = \frac{(Ws \cdot Lp)^2 \cdot Rp}{Rp^2 + (Ws + Lp)^2}$$

$$L2 = \frac{Lp \cdot Rp^2}{Rp^2 + (Ws \cdot Lp)^2}$$

provided that $$Rp = \frac{K \cdot r}{\sin\theta - K}, \quad Lp = \frac{Rp \cdot r}{Rp + r} \cdot \frac{\cos\theta}{Ws}$$

From this the values of R3 and L2 are simultaneously calculated. The calculated constant is compared with reference data and judged for their fitness.

In the case of a parallel connection of a coil Lx and a series connection of a capacitor Cx and resistor Rx, their constants are calculated by measuring the amplitude and phase difference.

In the case of the parallel connection of Lx and Rx, their constant values can be calculated from $$Rx = \frac{K \cdot r}{\sin\theta - K}, \quad Lx = \frac{Rx \cdot r}{Rx + r} \cdot \frac{\cos\theta}{Ws}$$

In the case of the series connection of Cx and Rx, their constant values can be calculated from $$Rx = \frac{Rp}{1 + (Ws \cdot Cp \cdot Rp)^2}, \quad Cx = \frac{1 + (Ws \cdot Cp \cdot Rp)^2}{Ws^2 \cdot Cp \cdot Rp^2}$$

provided that $$Rp = \frac{K \cdot r}{(\cos\theta - K)}, \quad Cp = \frac{Rp + r}{Rp \cdot r} \cdot \frac{\tan\theta}{Ws}$$

In this circuit arrangement, the signal generator 100, signal processing circuit 101, standard resistor switching circuit 105, and switches S1 to S6 in the multiplexer section 107 constitute one set. The signal generator 103, signal processing circuit 104, standard resistor switching circuit 106 and switches S7 to S12 constitute another set. Such sets of circuit arrangements are provided in plural number.

Such set of circuit arrangements can be controlled alternately and simultaneously parallely such that one set of circuit arrangement performs a measuring operation while another set of circuit arrangement performs a calculation processing operation. For this reason, the circuit arrangement can test a number of component parts in the unit 108. When the measuring is completed the result of measuring is printed on the printer 64 and displayed on the display 68.

In the signal processing circuit of the above-mentioned circuit arrangement an operational amplifier is used. Explanation will now be made of a measuring method using the operational amplifier.

Figure 9:
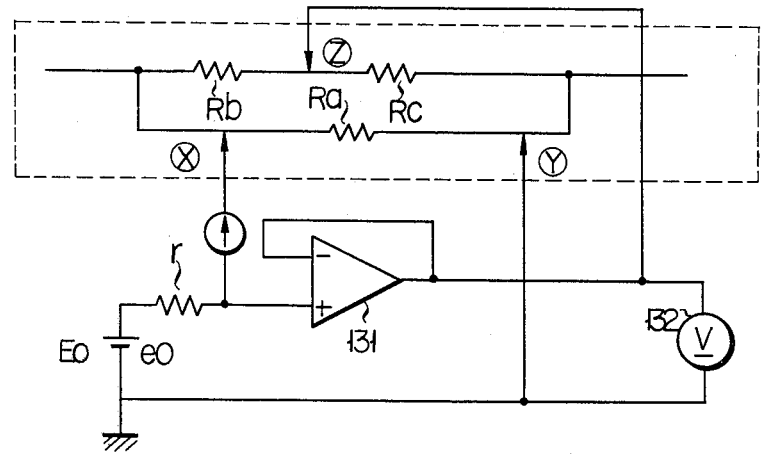
FIGS. 9 and 10 are views showing an equivalent circuit formed while checking of parts is effected by the circuit of FIG. 8.

For example, there is the case where only a resistor Ra is desired to be measured in a circuit network in which the resistor Ra is connected, as shown in FIGS. 9 and 10, in parallel with a series circuit of resistors Rb, Rc. In this case it is assumed that the value of the resistor Ra is greater than the combined value of the resistors Rb and Rc. The value of the resistor Ra of such circuit network can be measured by forming a circuit arrangement as shown in FIGS. 9 or 10.

In FIG. 9, Ra, Rb, Rc show resistors in the to-be-tested unit. r shows a standard resistor; 131, an operational amplifier; 132, a voltmeter; and Eo, a DC power supply. The DC voltage eo of the DC power supply Eo is applied to one and of the resistor Ra through the standard resistor r and to the ⊕ side input terminal of an operational amplifier 131. The output terminal of the operational amplifier 131 is short-circuited to the ⊖ side input terminal of the operational amplifier 131. A voltage on the output terminal of the operational amplifier is applied to a junction of the resistors Rb and Rc.

Short-circuiting is established between the other terminal of the resistor Ra and the reference potential terminal and the voltmeter 132 is formed such that it is connected between the output terminal of the operational amplifier 131 and the terminal of a reference potential. As shown in FIG. 10 the voltmeter 132 may be formed such that it is connected between the ⊕ side input terminal of the operational amplifier 131 and the reference potential terminal.

In such a mode of measuring, the amplification of the operational amplifier 131 is +1 and a potential on the ⊕ side input terminal of the operational amplifier 131 and a potential on a Ⓩ point i.e. the junction of the resistors Rb and Rc where the output terminal is connected are stabilized and can be maintained at the same level.

As a result, electric current resulting from the application of the voltage of the DC power source Eo follows through the resistor Ra only, not through the resistors Rb, Rc. By so doing, the voltmeter 132 can measure a voltage on a voltage dividing point between the standard resistor r and the resistor Ra.

That is, the so divided voltage Ef becomes $$Ef = \frac{Ra}{r + Ra} Eo$$

According to the above-mentioned measuring method, even if induction voltage resulting from the applied frequency signal occurs at the ⊕ side input terminal of the operational amplifier 131 no potential difference occurs between Ⓧ and Ⓩ in FIG. 9 or 10 because the gain of the operational amplifier 131 is +1. In the case of the induction voltage only, a stable, divided voltage can be measured without importing no substantial influence to the current through the resistor Ra. Even if the boltmeter is connected as shown in FIGS. 9 and 10, the same operation can be obtained because the gain of the operational amplifier 131 is +1.

The above-mentioned automatic parts testing apparatus automatically abuts a plurality of contact pins against the printed circuit board and tests by an automatic microprogram processing whether or not component parts of desired values are present in the desired positions.

Figure 11:
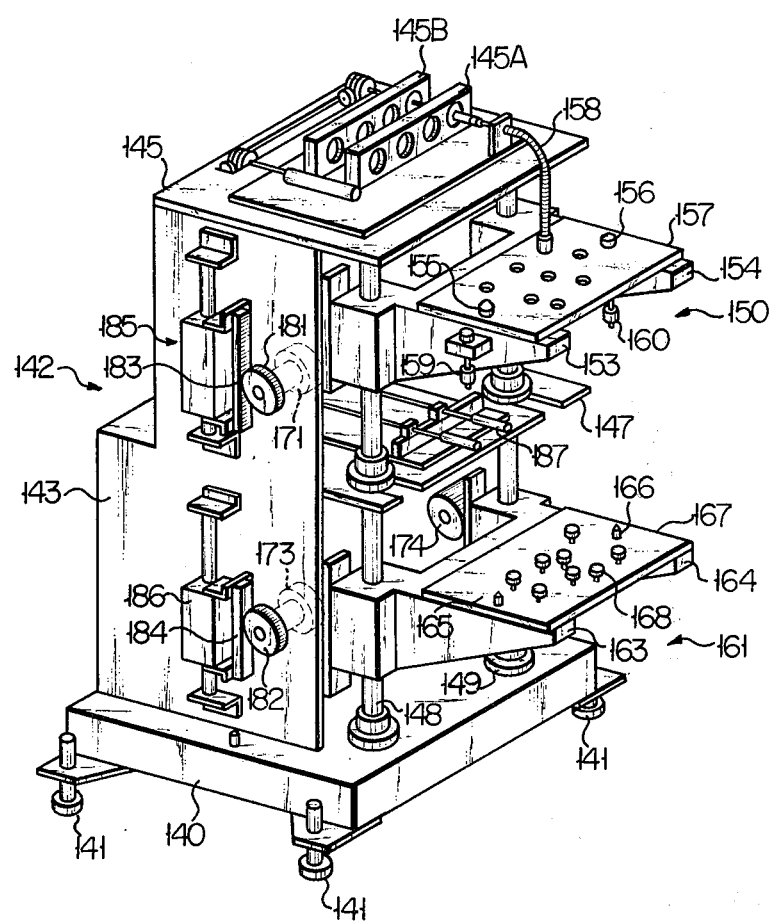
FIG. 11 is a schematic view showing an automatic parts measuring/adjustment device of FIG. 1.

The automatic parts measuring/adjustment device OI will be explained below by referring to FIG. 11. The automatic parts measuring/adjustment device OI includes a base 140, base adjusting means 141 etc. as in the above-mentioned automatic parts testing device OF. 142 shows a device casing and includes side plates 143, 144 (144 is not shown), top plate 145, support plate 147 etc. 148, 149 show first and second guide shafts and upper and lower arm tables 150 and 161 are mounted such that they can be moved up and down.

A pallet for driver which is formed of a transparent synthetic resin plate is spanned between arms 153 and 154 of the upper arm table 150. The pallet 157 includes a plurality of through holes and a driver device 158 for adjusting component parts on the circuit board is mounted in the desired hole. The driver device 158 is mounted such that its forward end is present below the pallet. Positioning pins 159, 160 are downwardly projected from the sides of the arms 153, 154 so as to accurately position a printed circuit board moving below the arm.

The lower arm table 161 similar to the above-mentioned arm table 150 is fitted to the first and second guide shafts 148, 149 in the same fashion. A pallet 167 for contact pin which is formed of a transparent synthetic resin plate is spanned between the arms 163 and 164 of the lower arm table 161 utilizing mounting screw means 165, 166. The pallet 167 has a plurality of through holes and contact pins 168 for measuring component parts or circuits are mounted in the desired through holes of the pallet such that they are upwardly projected.

The arm tables 150, 161 are moved up and down by the same means as that of the above-mentioned automatic parts testing device. 185, 186 show double acting type air cylinders; 181, 182 and 171, 173, 174 show pinions, and 183, 184 show racks.

The automatic parts measuring/adjustment device OI includes driver devices 158, 187 etc. To-be-adjusted component parts on the printed circuit board are such that some is directed upward and some is directed horizontally. For this reason, the driver device 187 is mounted on the support plate 147 as well as on the pallet 157.

The automatic parts testing device so constructed is operated as follows. When as explained in FIG. 12 the upper air cylinder 185 is moved in a direction of a15 as indicated by an arrow, the pinion located outside the side plate 143 is rotated by the rack 183 and the inner pinion 171 is rotated in the direction of a17 as indicated by an arrow a17. By so doing, the upper arm table 150 is downwardly moved in the direction of a16 as indicated by the arrow to cause the printed circuit board OS supported by the pallet OR to be held down by the hold-down rod $157_1$. The rod $157_1$ is positioned such that it can hold down the circuit board utilizing a spacing between the component parts on the circuit board.

Then, the lower air cylinder 186 is driven in the direction of a16 as indicated by the arrow to cause the pinion 182 to be rotated in the direction a20 to permit the lower arm table 161 to be raised in the direction of a15. When this is done, the contact pin 168 is contacted with the soldered terminal of the desired component parts. In this case, the contact pin 168 has a cushion mechanism in the direction of arrows (a15←→a16) which is designed to cause all the contact pins to be contacted with the desired terminals irrespective of the length of the soldered terminals. The shaft of the driver device is controlled to permit its forward end to be fitted into the corresponding component parts to be adjusted.

The respective component parts are automatically checked, measured and adjusted with the contact pin 168 in contact with the terminals of the parts. The measuring and adjustment include measuring an automatic gain controlled voltage by, for example, inputting a predetermined reference signal to the input section of an intermediate frequency amplifier circuit and varying the reference signal in various ways to check whether or not a predetermined output is obtained and so on.

The driver device is automatically rotated, as required, for circuit adjustment. The measuring and adjustment is effected by a microcomputer. When the processing effected at the machine section is completed, the air cylinder, pinion etc. are returned to the original position and the arm table is returned to the original position in readiness for the next processing. The driver device is mounted on the support plate 187 so as to adjust component parts in the horizontal direction of the circuit board.

The driver devices, though shown in lesser number, can be increased according to the component parts required for adjustment. The basic portion of the driver device 158 is supported by mounting plates 145A, 145B etc. having a plurality of mounting holes. Screws $183_1$, $184_1$ are stoppers for regulating the position of the racks 183, 184.

Figure 13:
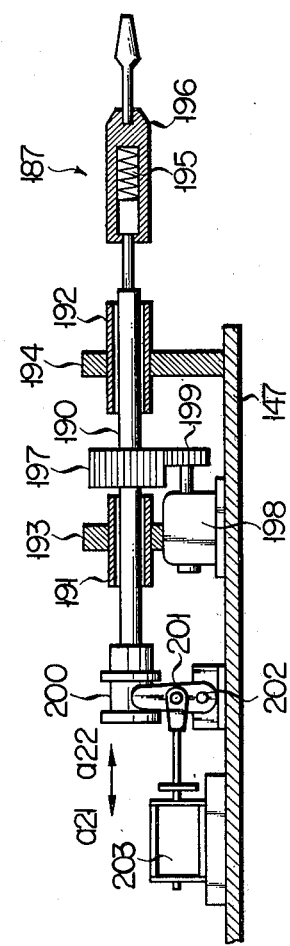
FIG. 13 is an explanatory view showing the arrangement of a driver device as used in the automatic parts measuring/adjustment device of FIG. 11.

The driver device mounted to the support plate is constructed as shown in FIG. 13. Bearing sections 191, 192 journaling a shaft 190 are held by retaining plates 193, 194.

An adjusting pin 196 is mounted on the forward end of the shaft 190 and axially urged by a spring 195. The adjusting pin 196 and shaft 190 are rotated as one unit due to the angular cylinder section fitted in the adjusting pin, but the adjusting pin has a damping effect against the spring in the axial direction. A gear 197 is mounted as one unit on the portion of the shaft 190 and operated in interlock with a gear 199 of a motor 198. A grooved collar 200 is coaxially fixed on the rear end portion of the shaft 190 and a cam 201 is slidably contacted with the groove of the collar 200. The cam 201 is driven by, for example, an air cylinder 203 in a direction of a21←→a22 as indicated by arrows with a pivoting point 202 as a center. The driver device 187 is such that when the shaft 190 is driven by the air cylinder 203 in a direction of a22 as indicated by the arrow the adjusting pin 196 is fitted into the to-be-adjusted location of electronic component part toward which the pin 196 is moved. The adjustment of the component parts can be effected by the rotation of the motor 198.

The driver device mounted on the top plate of the automatic parts measuring adjustment device OI is constructed as follows.

Figure 14:
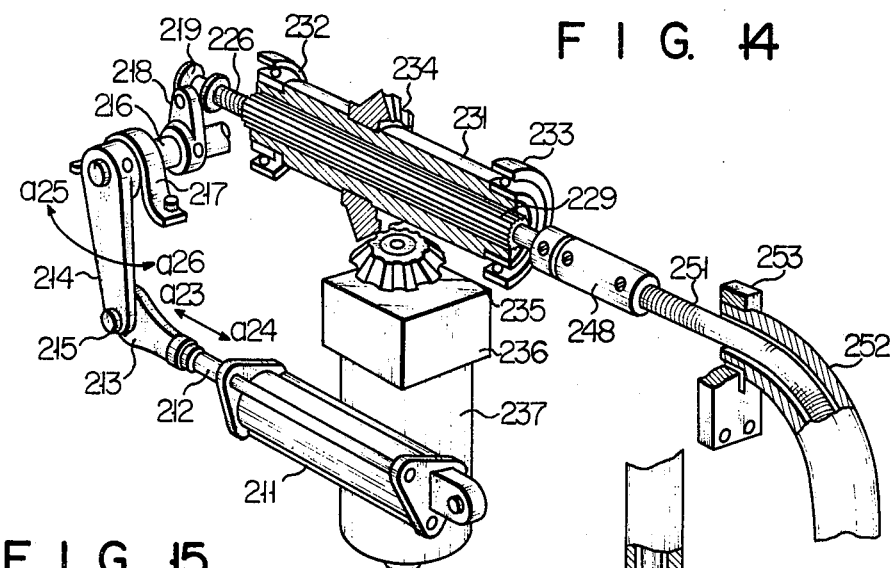
FIG. 14 is an explanatory view showing one form of a driver device as used in the automatic parts measuring/adjustment device of FIG. 11.

In FIG. 14, 211 shows an air cylinder which is fixed, for example, to the lower surface of the top plate of the automatic parts measuring/adjustment device. A piston shaft 212 of the air cylinder 211 is attached by a shaft 215 to one end portion of a can 214 through a universal joint 213. The base end portion of the cam 214 is projected up through the opening of the top plate and fixed on one end portion of a rotating shaft 216. The rotating shaft 216 is held by a bearing 217 such that it can be rotated. The bearing 217 is secured by screws etc. to the upper surface of the top plate. A cam 218 has its base end portion fixed on the other end portion of the shaft 216 such that the cam 218 is rotated as one unit. The forward end portion of the cam 218 upwardly extends and is associated with the groove of a grooved collar 219.

The above-mentioned arrangement constistutes an axial driving means of the driver device and when the piston shaft 212 of the air cylinder 211 is driven in the direction of a23←→a26 the cam 214 is rotated in the direction of a25←→a26 with the rotating shaft 216 as a center. As a result, the cam 218 is rotated in the direction of a25←→a26 and the grooved collar 219 can be driven in the axial direction.

The collar 219 is coaxially mounted on one end of a spline shaft 229. The grooved collar 219 is supported on one end portion of the spline shaft 229, as shown in FIG. 16, with a bushing 221 in between, and one end of the collar 219 is prevented by a stop ring 222 from being axially slipped out of the bushing 221. A coiled compression spring 226 is disposed between the other end of the grooved collar and a larger-diameter section 230 of the spline shaft 229 to urge the grooved collar 219 in a direction of a27←→a28. A ball bearing 224 mounted by a pin 225 on the cam 218 is fitted into the groove 223 of the collar 219. As a result, the grooved collar 219 is permitted to be rotated and can be pushed by the cam 218 in a direction of a27←→a28 even if it is rotated. When the grooved collar 219 is pushed in a direction of a28 as indicated by the arrow, an axial force is applied to the spline shaft 229 through the compression spring 226. If in this case the axial movement of the spline shaft 229 is controlled due to some hindrance, the compression spring 226 obsorbs its variation.

The spline shaft 229 has a larger-diameters section on its way and a plurality of parallel axial grooves are provided in the outer periphery of the larger-diameter section of the shaft 229. The larger-diameter section 230 of the spline shaft 229 is inserted, as shown in FIG. 14, into a cylindrical spline metal 231. The spline metal 231 has at its hollow inner surface those grooves corresponding to the grooves provided in the larger-diameter section of the spline shaft 229. In consequence, the spline metal 231 supports the spline shaft such that the latter can be freely moved in the axial direction, but the spline metal and spline shaft 229 are rotated as one unit in the rolational direction.

Figure 12:
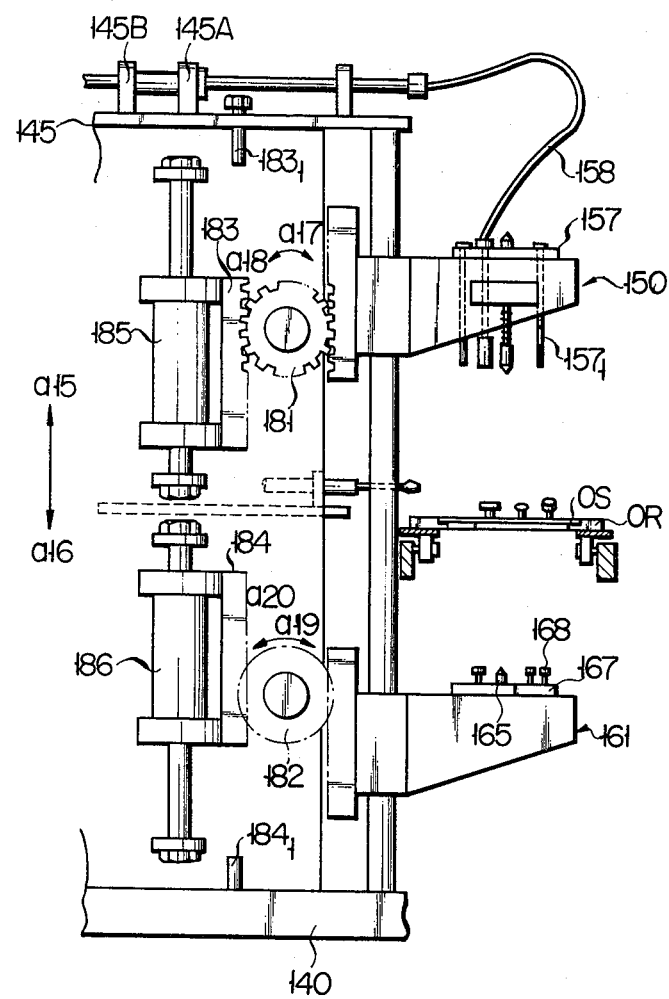
FIG. 12 is side view of the automatic parts measuring/adjustment device of FIG. 11.

Both the ends of the spline metal 231 are rotatably supported by bearings 232, 233. The bearings 232, 233 are fixedly secured to retaining plates 145A, 145B as shown in FIGS. 11 and 12 which are fixed to the top plate of the automatic parts measuring/adjustment device OI. As a result, the spline metal 231 is rotatable and on its intermediate portion a bevel gear 234 is coaxially mounted as one unit. The bevel gear 234 is intermeshed with a bevel gear 235 which is mounted on the rotation shaft of a reduction gear 236. The rotation of a motor 237 is transmitted to the reduction gear 236 which in turn causes the speed to be reduced for outputting. The reduction gear 236, motor 232 etc. permit the bevel gear 235 to be upwardly projected through an opening of a top plate mounted on the lower surface side of the top surface. In consequence, the rotation of the motor 237 is transmitted through a route of the reduction gear 236, bevel gear 235, bevel gear 234, spline metal 231 and spline shaft 229. This route constitutes a rotation driving means.

The other end of the spline shaft i.e. the output of the rotation driving means is coupled to a clutch means. The other end portion of the spline shaft 229 is fixed by a set screw 239 inserted into the axial hole of a boss 238. As shown in FIG. 17 the boss 238 has at its one end portion an axial hole 240 into which the other end portion of the spline shaft 229 is fixed, as well as the threaded hole 241 into which the set screw 239 for securing the spline shaft 229 is inserted. The other end portion of the boss 238 provides a hollow, smaller-diameter section. A ring-like seat 242 is firstly fitted on the smaller-diameter section of the boss which has an externally threaded forward portion, and then a ring 244 having a busing 243 on its inner surface and seat 245 are fitted on the smaller-diameter section of the boss 238. Then, a ring-like wavy spring 246 is fitted on the smaller-diameter section of the boss in a manner to push the seat 245 etc. toward the larger-diameter side of the boss and a double nut 247 is tighted toward these members to provide a clutch.

The open end of bottomed cylindrical clutch case 248 is fitted over the outer periphery of the ring 244. The ring 244 and clutch case 248 are secured by a screw 249 as one unit. One end portion of a flexible shaft 251 is inserted into the central axial hole of the bottom of the clutch case 248 and secured by a set screw 250. According to the above-mentioned clutch means the rotation of the spline shaft is transmitted to the boss 238. The ring 244 and clutch case 248, together with the boss, are rotated as one unit to cause a flexible shaft 251 to be rotated. When a greater load is applied to the flexible shaft 251, slipping occurs between the bushing 243 and the boss 238 to prevent the forced rotation of the flexible shaft 251. A loading limit for bringing about such slipping is adjusted by the extent of tightening of the double nut 247 as well as the frictional coefficient of the bushing 243, seats 242, 245 etc. The output of the clutch means is transmitted to the flexible shaft 251. The flexible shaft is constructed of a multi-layered wire.

As shown in FIG. 14 the flexible shaft 251 is inserted into a pliable tube 252 of synthetic resin. One end of the tube 252 is secured to a tube holder 253 which is fixed to the upper surface of the top plate. The forward end of the tube 252 and flexible shaft 251 extend in the following manner. The forward end of the tube 252 is coaxially fixed to one end of a driver cylinder 254. The driver cylinder 254 has a collar-like mounting blade 255 at its outer periphery. A screw hole is provided in the mounting blade 255 and the pallet for driver can be fixed utilizing the screw hole. One end portion of a transparent guide cylinder 256 of synthetic resin is fitted over the other end (forward end) portion of the driver cylinder 254. Axially elongated slits 257 are formed in that portion of the guide cylinder 256 to which the driver cylinder 254 has an overlapping relation. A pin 258 is externally inserted through the slit 257 and the forward end of the pin is threadedly mounted in the screw hole of the driver cylinder 254. A coil-like compression spring 259 is interposed between the end of the guide cylinder 256 and the mounting blade 255 of the driver cylinder. For this reason, the guide cylinder 256 is urged from the mounting blade toward the forward end thereof.

Normally, one end of the slit 257 is latched by the pin 258, but when depression as effected from the lower side the guide cylinder 256 can be elastically displaced toward the driver cylinder 254 over a length of the slit 257. In consequence, the pin 258, slit 257, compression spring 259 etc. provide a buffer means.

Figure 15:
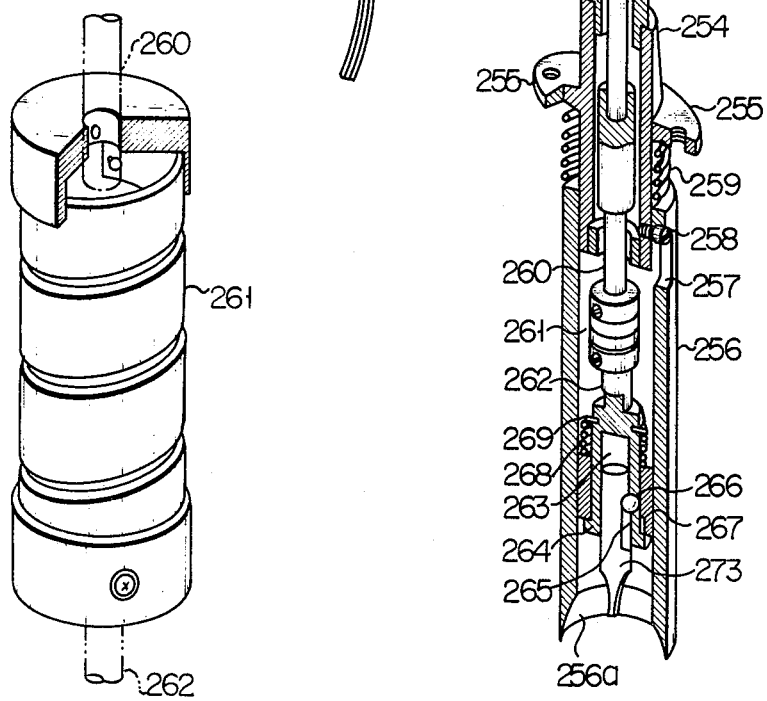
FIG. 15 is a perspective view showing a flexible joint of the driver device of FIG. 14.

The forward end of the flexible shaft 251 is fixed to one end of a connecting rod 260 which is provided in a piston fashion within the driver cylinder 254. The other end of the connecting rod 260 passes through the driver cylinder 254 and is mounted on a flexible coupling 261. The flexible coupling 261 is formed of, for example, spiral leaf spring and has its other end connected to a tip holding rod 262. As shown in FIG. 15, the flexible coupling 261 is formed of the spirally formed leaf spring and has elasticity in the axial direction. The flexible coupling can be elastically deformed also in the bending direction. The tip holding rod 262 has a tip inserting coaxial bore 263 at the other end. A collar-like latching portion 264 is formed integral with the forward end portion of the outer periphery of the tip holding rod 262.

In the neighborhood of the latching portion 264 a hole 266 of such a size as to permit a steel ball to pass therethrough is formed in the wall of the axial bore 263.

A steel ball checking cylinder 267 is fitted over the outer periphery of the tip holding rod 262 and urged toward the latching portion 264 for latching. That is, one end of the steel ball checking cylinder 267 is latched on the latching portion 264 and the other end of the steel ball checking cylinder 267 is urged by a compression spring 268. The compression spring 268 urges the steel ball checking cylinder 267 at its one end and is anchored by a stop ring 269 which is attached to the outer periphery of the tip holding rod 262. At one end side of the steel ball checking cylinder 267 the inner diameter of the cylinder 267 portion which is located at the side of the latching portion is formed thicker than the outer diameter of the corresponding portion of the tip holding rod 262 i.e. thinly formed to provide a clearance 270 for the steel ball 266. The steel ball checking cylinder 267, compression spring etc. provide a tip replacing means.

The tip replacing means will be explained in more detail below by referring to FIG. 18. A tip 273 is inserted in the axial bore 263 of the tip holding rod 262 such that a spring 272 is compressed. A steel ball groove 274 of a proper length is axially formed in the portion of the outer surface of the inserting portion of the tip 273. The steel ball 265 is lodged in the steel ball groove 274 and a hole 266 of the chip holding rod 262. Where the steel ball checking cylinder 267 is pushed by the compression spring 268 to permit it to be latched onto the latching portion 264, the cylinder length, the groove position etc. are set such that the steel ball 265 is pushed by the smaller-diamerter inner wall of the steel ball checking cylinder 267.

The above-mentioned tip replacing means is such that when the steel ball checking cylinder 267 is downwardly pushed in a direction of a29 against the force of the compression spring 268 the steel ball 265 can pop out into the clearance 270 of the steel ball checking cylinder 267. This is because the tip 273 is pushed by the spring 272 in the direction of a30 and because the steel ball groove 274 of the tip 273 permits the steel ball 265 to be pushed by its end toward the hole 266. By so doing, the tip 273 can be removed away from the tip holding rod 262 or replaced.

As the tip 273 use is made of a flat-tipped type made of, for example, sapphire. The tip can be replaced when it is broken or worn out. A latching means or a square-pillar-like engaging means are provided such that the tip 273 and tip holding rod 262 are rotated as one unit.

The tip holding rod 262, steel ball checking sylinder 267, tip 273 etc. are coaxially disposed within the guide cylinder 256. If rotation is caused when the forward end of the tip 273 is fitted into the to-be-adjusted portion of the to-be-adjusted component part, the component part can be adjusted.

In FIGS. 14 and 19 the guide cylinder 256 is transparent and a flaring surface 256 of the guide cylinder is provided at the forward end portion such that the diameter thereof becomes greater. The tip is guided into the to-be-adjusted portion of the to-be-adjusted component part during the lowering operation by the driver device to permit it to be fitted into the to-be-adjusted portion of the to-be-adjusted component part. In this case, the forward end of the tip 273 is fitted into the to-be-adjusted portion of the to-be-adjusted component part. Thereafter, the tip 273 is rotated to permit the component part 275 to be adjusted.

Figure 20:
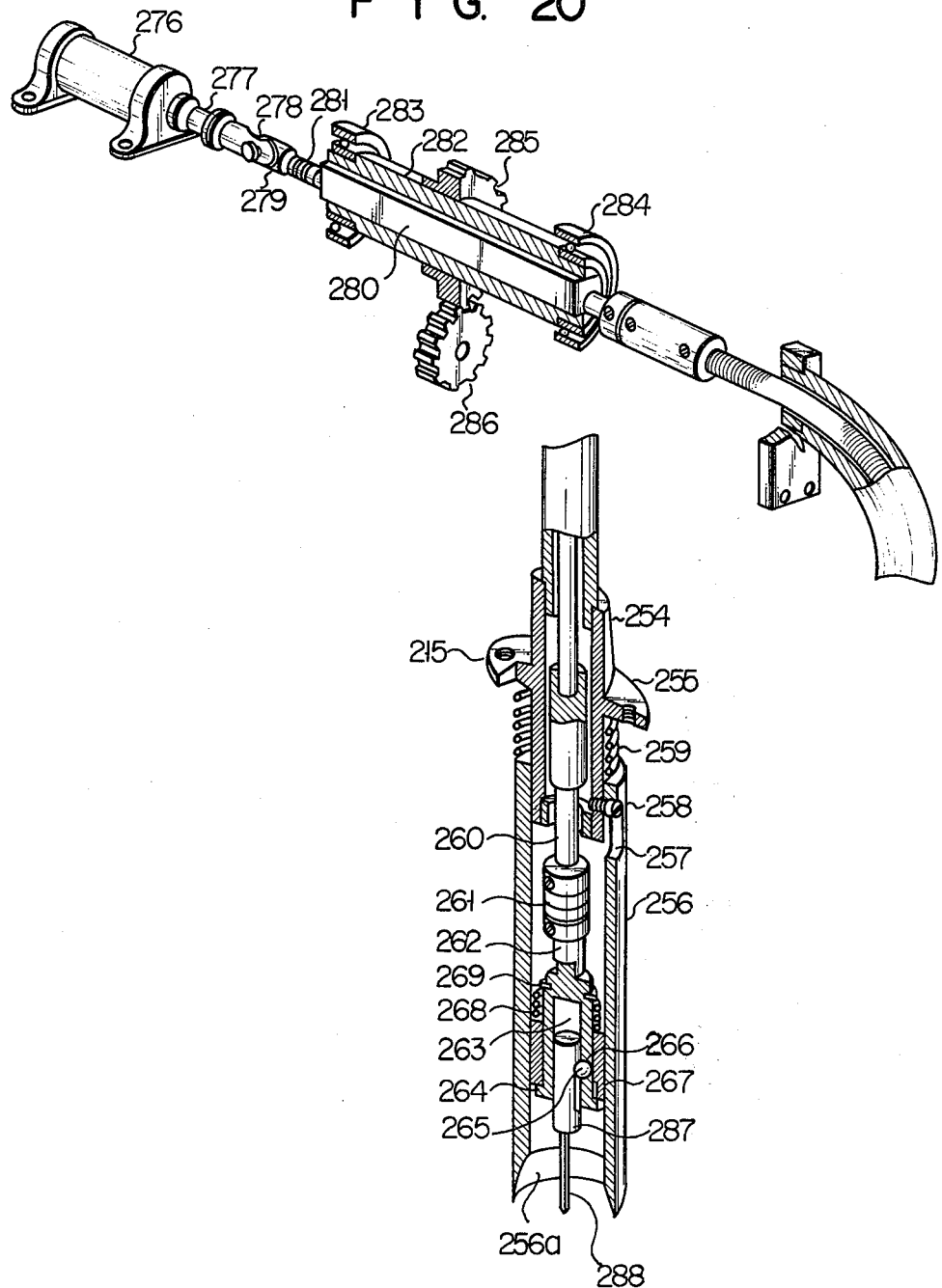
FIG. 20 is an explanatory view showing another form of driver device as used in first and second automatic parts measuring/adjustment device of FIG. 11.
Figure 21:
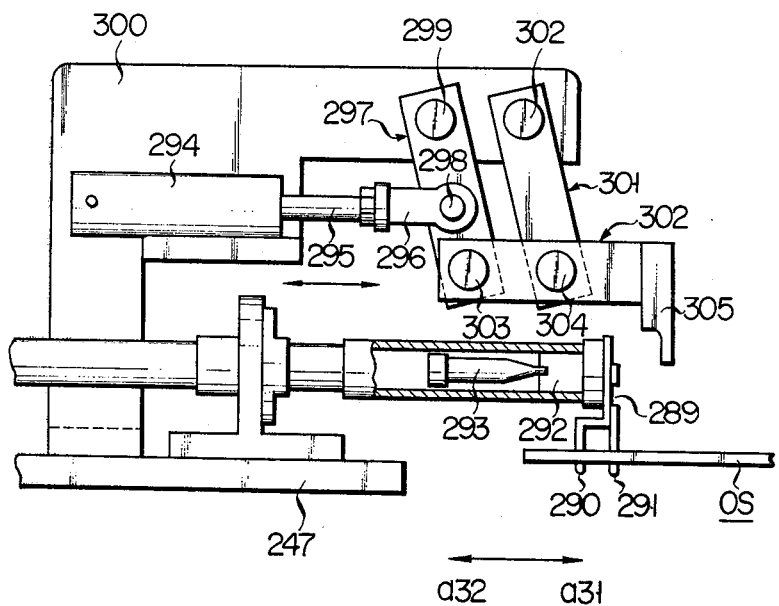
FIG. 21 is an explanatory view showing one form of a parts supporting means as used in the first and second automatic parts measuring/adjustment device of FIG. 11.

In the above-mentioned driver device the axial driving means and rotational drive means achieve the same object even if they are formed as shown in FIG. 20.

In FIG. 20, 276 is an air cylinder and a piston shaft 277 is coupled by a universal joint 278 to a ring 279. The ring 279 is fitted over one end portion of an angular spline shaft 280 in the same method as that of the grooved collar 219 as explained in connection with FIG. 16. A compression spring 281 is interposed between the ring 279 and the larger-diameter section of the spline shaft 280. The spline shaft 280 is inserted into the corresponding angular bore of a spline metal 282. The spline metal 282 is cylindrical in its outer periphery and both the ends of the spline metal 282 are rotatably supported in the same bearings 283, 284 as explained in connection with FIG. 14. A gear 285 is coaxially mounted on the intermediate portion of the spline shaft. The gear 285 is intermeshed with a gear 286 which can be rotated by a motor.

In the axial drive means and rotational drive means the piston shaft of the air cylinder 276 is arranged in the same direction as that of the spline shaft 277 and an ordinary spur gear is used in place of the bevel gear.

The above-mentioned tip 273 may have not only a forward flat end, but also a tapering angular end and the configuration of the forward end of the tip is made to correspond to the configuration of the hole of the to-be-adjusted component part.

A tip 287 as shown in FIG. 20 has its forward end equipped with an angular adjusting pin 288. The angular adjusting pin 288 is formed of, for example, sapphire.

The above-mentioned driver device is so operated that in the automatic parts measuring/adjustment device IO the tip is fitted into the predetermined position of the component part. In this case, however, the to-be-adjusted component part must be stably mounted and secured. In particular, when the tip is moved in the horizontal direction so as to be fitted into the to-be-adjusted component part there occur the cases where the to-be-adjusted component part is inclined.

Where a to-be-adjusted component part 289 whose terminals 290, 291 are mounted upright with respect to the printed circuit board OS has its to-be-adjusted portion 282 directed in the horizontal direction of the circuit board, the supporting effect is weaker in the direction of a31 as indicated by an arrow. In this case, a tip 293 of the driver device is pushed in the direction of a31 toward the to-be-adjusted component part 289 so that it is fitted into the to-be-adjusted portion of such component part. Therefore, a parts restricting means is provided to restrict an unauthorized movement of the component part. The parts restricting means is comprised of, for example, an air cylinder 294 and link mechanism. That is, a piston shaft 296 of the air cylinder 294 is disposed such that it can be reciprocably moved, for example, above the printed circuit board OS and horizontally in the same direction as that of the horizontal surface of the printed circuit board. These parts, though not shown, are fixed by a mounting means on the upper surface of a support plate 247 of the automatic parts measuring/adjustment device as shown in FIG. 11. A piston shaft 295 of the air cylinder 294 is coupled by a universal joint 296 to the intermediate portion of a link lever 297. The link lever 297 and universal joint 296 are rotatably assorciated by a shaft 298. The link lever 297 is disposed above the printed circuit board OS such that it extends vertically, and has its upper end portion rotatably mounted through a support shaft 299. 300 shows a mounting arm mounted on, and secured to, the support plate 247. A link lever 301 is mounted on the support shaft 302 such that it is arranged parallel with the link lever 297 and in the same direction as that of the driver shaft. The link levers 297, 301, mounting arm 300 etc. are arranged such that they provide a horizontal link 302 as shown by a parallelogram, and attached by shafts 303, 304 to the respective link levers 299, 302. At the side of one end of the horizontal link 302 a component part holding finger 305 is mounted on that portion of the horizontal link which confronts the to-be-adjusted component part.

The parts regulating means is constructed as mentioned above. When the piston shaft 295 of the air cylinder 294 is driven in the direction of a32 the link mechanism is pulled horizontally in the direction of a32. At this time, the parts holding finger 305 supports the to-be-adjusted component part in a direction opposite to that in which the depressing force of the driver device is applied. For this reason, the position of the to-be-adjusted component part is made stable during the adjusting operation, permitting a smooth adjustment by the driver device and smooth mating of the tip with the component part.

The first automatic parts measuring/adjustment device OI is constructed as mentioned above and permits automatic adjustment of the component part. The circuit section for adjustment is set by a microcomputer-controlled system. Referring back to FIG. 1, the printed circuit board sent by the conveyor OD for test process has its pallet positioned by the lowering of the upper arm table. Then, the contact pin is contacted with a desired circuit terminal and the driver device is associated with the desired component part by its axial drive means. Then, the turning ON or OFF of the power supply and measurement of circuit characteristic are effected through the contact pin. According to the result of measurement the drive means of the driver device is controlled. When the result of measurement falls within the desired range, the measuring/adjustment operation is finished, causing the upper and lower arm tables to be returned to the original position in readiness for the next processing. Where a deflection circuit board incapable of adjustment is detected, the fit/unfit descriminating function works, parmitting the sorting operation to be effected by the sorting device OJ. The fit circuit board is sent to the second automatic parts measuring/adjustment device OK.

The first automatic parts measuring/adjustment device OK is similar in its mechanical arrangement to the preceding device OI and different therefrom in respect of the object to be adjusted.

The electric system of the automatic parts measuring-/adjustment devices OI and OK will be expained below.

Figure 22:
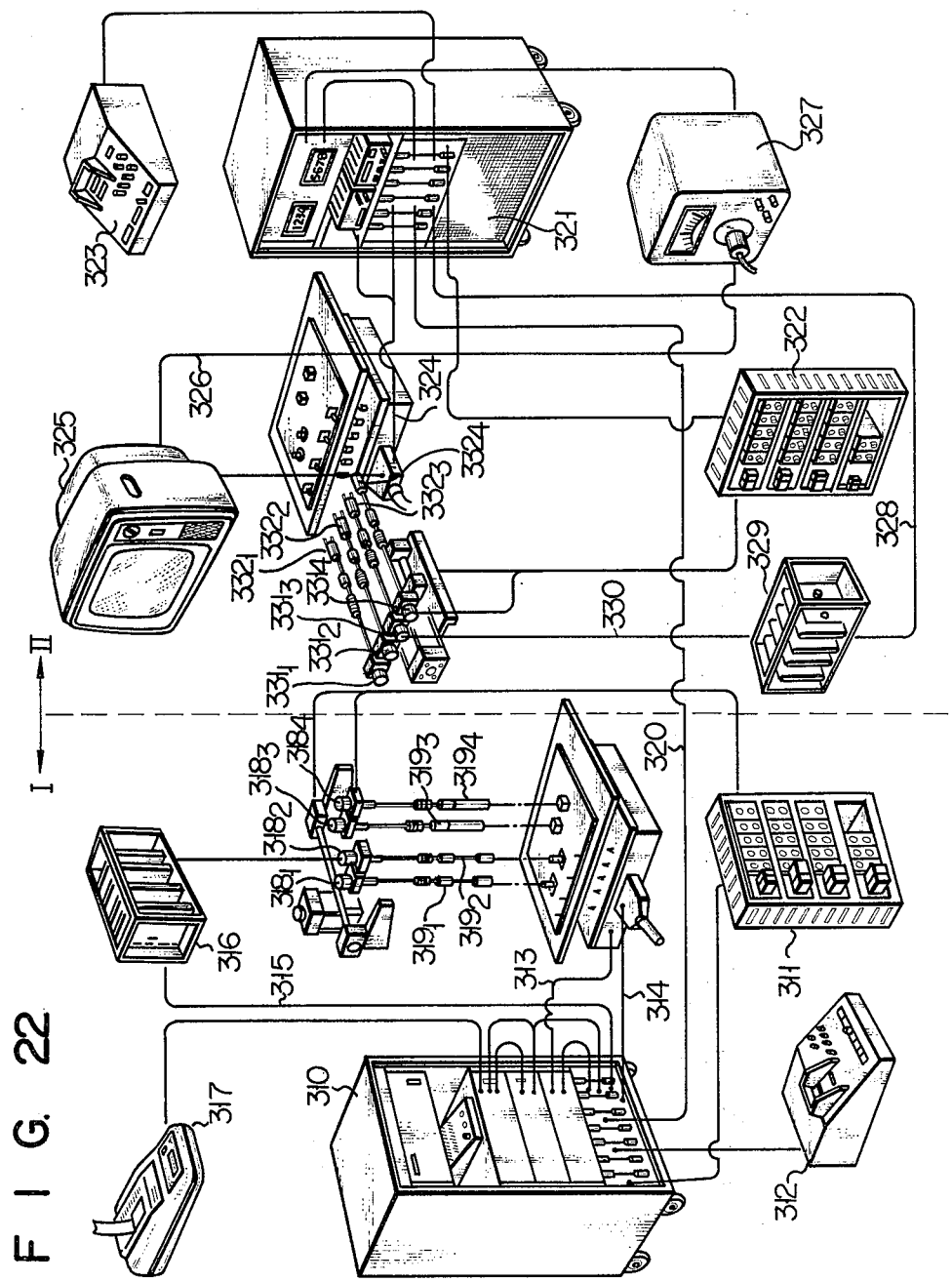
FIG. 22 is an explanatory view showing an electrical system as used in the first and second automatic parts measuring/adjustment device of FIG. 1.

In FIG. 22, 310 shows an electronic computer which stores a program and data, collects data on each section and delivers an output. The electronic computer 310 is connected to the peripheral device of each section. In FIG. 20 a system area I is on the side of the automatic parts measuring/adjustment device OI and primarily includes a system for adjustment of the receiving system unit of, for example, a printed circuit board for TV receiver. A system area II is on the side of the automatic parts measuring/adjustment device OK and primarily includes a system for adjustment of a deflection system unit.

Explanation will be given below, starting with the system area I side. 311 shows a machine control device which controls the upper and lower arm tables of the first automatic parts measuring/adjustment device, as well as the holding of the printed circuit board, the contacting of the contact pin, the axial driving of the driver device, the supporting of the component parts, and so on. 312 shows as operator console. The operator console has the function of externally introducing control information into the system or displaying the processing status when the omitting of the measuring/adjustment operation, remeasuring/adjustment operation etc. are to be effected or an interrupt processing is to be effected. 313 shows a line for supplying power from the power supply to the contact pin side and 314 shows a line for selecting the contact pin with respect to the portion to be measured or adjusted or inputting or outputting information. 315 shows a line for transmitting control information to a pulse motor drive unit 316. The pulse motor drive unit 316 controls a motor based on the input information. The driver device has its rotational drive means operated thereby. 317 shows a digital printer which prints and records the number and fitness of the printed circuit board to be measured or adjusted, and the code etc. of the unfit circuit board. Driver sections $319_1$, $319_2$, $319_3$, $319_4$ driven by pulse motors $318_1$, $318_2$, $318_3$, $318_4$ etc. are used for example, for adjustment of an automatic gain control circuit, for adjustment of an automatic tuning frequency control circuit, for adjustment of an intermediate frequency tuning circuit of the automatic tuning frequency control circuit and for adjustment for a sound detection coil. The driver section $319_1$ can rotate a dust core of a detection coil for vedeo detection. The driver section $319_2$ can rotate the dust core of a detection transformer for determining the pull-in frequency of the automatic tuning frequency control circuit. The driver section $319_3$ can rotate a variable resister for adjusting a DC offset voltage which is an output of the automatic tuning frequency control circuit. The driver section $314_4$ can rotate a dust core of a sound detection transformer.

The above-mentioned electronic computer controls the system area II side and is connected over a data line 320 to an interface module device 321. The interface module device 321 controls each section of the system area II based on the data sent from the slectronic computer 310 as well as returns data such as the result of calculation to the electronic computer side. The interface module device 321 effects transfer of control information with respect to the machine control device 322. The machine control device 322 controls the sandwiching of the printed circuit board by the upper and lower arm tables of the second automatic parts measuring/adjustment device OK, the axial driving of the driver device, the supporting of the component parts, and so on. 323 shows an operator console. The operator console 323 has the function of externally introducing control information into the system when the omitting of the measuring/adjustment operation, remeasuring/adjustment etc. are to be effected or when an interrupt processing is to be effected. A line 324 is provided for selecting the contact pin for supply of a signal (for television) or introducing the circuit output to the interface mode device 321. A signal supplied over the line 324 to the to-be-tested unit is also supplied to a monitor television receiver 325 to permit the image state to be monitored. A high-voltage power supply output of the monitor television receiver 325 is supplied over a line 326 to a high-voltage divider 327 where measurement is effected. The output of the high-voltage divider 327 is supplied to the interface module device 321 and a comparing calculation etc. are effected between the digital signals. A data signal obtained from the contact pin through the line 324 is introduced into the interface module device 321. Dependent upon its value the result of calculation for adjustment is obtained and control data for this is inputted through a line 328 into a pulse motor drive unit 329. The pulse motor drive unit 329 is connected over a line 330 so as to control the rotation of a motor of the second automatic parts measuring/adjustment device OK.

Driver sections $332_1$, $332_2$, $332_3$, $332_4$ driven by pulse motors $331_1$, $331_2$, $331_3$, $331_4$ etc. are used, for example, for adjustment of a vertical hold circuit, for adjustment of a horizontal hold circuit, for adjustment of a chroma signal and for adjustment of a main power supply circuit.

The driver device so constructed is utilized for the automatic parts adjustment device etc. and very effective. The driver device has its guide cylinder fitted into the to-be-adjusted component part when the pallet is horizontally moved and lowered (see FIG. 19). Then, the axial drive means is operated to cause the tip to be fitted int the to-be-adjusted component part. When the pallet is controllably moved the flexible shaft can be correspondingly traced according to its movement. However, the pliability of the flexible shaft can not be utilized when the flexible shaft is laterally moved at a position lower than that of the pallet. For this reason, a flexible joint is interposed between the connecting rod below the pallet and the tip. Even if the mating portion of the to-be-adjusted component part is inclined, the above-mentioned arrangement permits the forward end of the tip to be moved according to its inclination for mating. This permits the mounting accuracy of the to-be-adjusted component parts, as well as the assembling accuracy of the driver device, to be alleviated. Since the forward end of the tip is always stably fitted into the to-be-adjusted component part the breakage of the mating portion of the to-be-adjusted component part or the breakage of the foward end of the tip is prevented. As a force is applied in the direction of stabilization no misadjustment occurs when the tip is removed.

A control circuit for rotatingly driving the driver device to adjust the circuit will be explained below in connection with the first automatic parts measuring/adjustment device.

Supporse that, for example, a color television receiver is broadly divided into a receiving system circuit and deflection system circuit. In the receiving system circuit it is necessary to effect the adjustment of a transformer to be matched with a surface wave filter of a vedeo intermediate frequency amplifier circuit, the adjustment of a detection coil for synchronization detection, the adjustment of a detection transformer of an automatic frequency tuning (AFT) circuit and adjustment of its offset voltage, the adjustment of a detection transformer of a sound detection circuit and so on.

If these adjustments are manually effected, a great deal of time and skill is necessary. The first automatic parts measuring/adjustment device per se these adjustments automatically and efficiently in proper order.

The electrical arrangement of this device will be explained in connection with FIG. 23. 350 shows a printed circuit board which is of a larger type as used in a color television receiver. The printed circuit board 350 is sent to the location of the earlier-explained first automatic parts measuring/adjustment device where the driver device is fitted into the to-be-adjusted component part and where contact pin is abutted against the desired terminal. 351 shows a vedeo intermediate frequency amplifier circuit on the printed circuit board 350, 352 shows an automatic tuning frequency control circuit and 353 shows a sound detection circuit. These circuits have component parts to be adjusted. 354, 355, 356, 357, 358 show pulse motors for mechanically adjusting the component parts and are equipped with jigs and driver devices for adjustment of the component parts of the corresponding shape.

The pulse motor 354 rotates a dust core of a transformer for matching with a surface wave filter for determining a vedeo intermediate frequency band. The pulse motor 355 rotates a dust core of a detection coil for vedeo detection. The pulse motor 357 rotates a dust core of a detection transformer for determining the pull-in frequency of AFT. The pulse motor 358 is provided for rotating a variable resistor for adjusting a DC offset voltage which is an AFT detection output. The pulse motor 356 is provided for rotating the dust core of a sound detection transformer.

The pulse motors 354, 355, 356, 357, 358 etc. are driven by the output of a motor drive circuit 360 in the normal or reverse direction. In this case, a control section 361 delivers a control output to the motor drive circuit, said control output being used to control select information of a motor to be driven and its order, as well as the rotation direction, stopping etc.

The outputs of the vedeo intermediate frequency amplifier circuit 351, automatic tuning frequency control circuit 352, sound detection circuit 353 are inputted to the to-be-selected input terminals A, B, C of a switching circuit 354. The output of the switching circuit 364 is converted to a digital value and inputted to the control section 361.

The above-mentioned vedeo intermediate frequency amplifier circuit 351 is normally provided in an automatic gain controlled (AGC) circuit and has the function of maintaining the detection output at a predetermined level. Where a single sinusoidal wave is inputted for adjustment, it is necessary to externally control a DC voltage for gain adjustment which is delivered from the AGC circuit. In the apparatus of this invention a digital/analog converter 366 is provided to adjust AGC voltage so that a linearity-good response is obtained. Such correction is realized by obtaining proper AGC application voltage data through utilization of a calculation circuit in the control section 361 and applying this data to the digital/analog converter circuit 366.

The control section 361 can adjustably control a frequency synthesizer circuit 368, attenuator 369 etc. in a signal generating section 367. That is, it is provided to permit a specified signal whose contents is beforehand determined to be generated from the signal generating section 367. The specified signal, when it is inputted into the circuit of the printed circuit board 350, suffers varions processings, such as detection processing, attenuation, separation etc. By monitoring the output of each circuit, judgement can be effected as to whether or not its output has a desired signal characteristic. This is because, since the nature of a signal inputted into the circuit is beforehand known, it is possible to predict an expected nature with respect to a signal outputted from each circuit. The predicted data, is beforehand stored in a read-only memory section 362 and derived out of the read only memory section 363, if necessary. A calculation circuit 370 in the control section 361 compares actual measured data with the predicted data.

The above-mentioned control circuit, read-only data memory section, read-only program memory section will be explained below by referring to FIG. 24. In FIG. 24, 371 shows an input/output register, 272 shows a program counter and 373 shows a control circuit. The read only memory section 362 includes a memory circuit 375, data buffer 376 and address decoder 377. A read only program memory section 363 includes a memory circuit 378, data buffer 379 and address decoder 380. By the above-mentioned system the program counter 372 in the control section 361 reads a program out of the read only program memory section through the address decoder 380 so that it can be run in order. In this case, the input/output register 372 delivers data for generating a predetermined signal to the signal generating section 376, as well as data on the contact pin in contact with the input/output terminals of a predetermined circuit and select data of the switching circuit 364. Predicted data when measurement is made is read out of the memory circuit 375 for supply to the calculation circuit 370. Then, the actually measured data is read through analog/digital converter circuit 365 for comparison with the predicted data. As a result of such processing, if there is an error, the pulse motor is driven through a motor drive circuit 360 and adjustment is effected such that such an error falls within an expected range. Data for making various levels, phases etc. variable is sent to the signal generating section 367 and checking is effected as to whether or not a signal obtained from the to-be-tested unit according to the parameter is a desired one and adjustment is made such that a desired signal can be obtained. The above-mentioned timing is effected by a control circuit 373. The above-mentioned circuit permits automatic and accurate adjustment to be effected for a brief period of time. According to this circuit, if the program memory and predict data are replaced, printed circuit boards for various apparatus can be adjusted and thus higher flexibility is assured.

In the above-mentioned embodiment, if the to-be-adjusted circuit includes the AGC circuit in particular, a digital/analog converter circuit 366 for DC-controlling the AGC circuit is used. For this reason, the gain adjustment of an intermediate frequency amplifier circuit which has been believed cumbersome is easily obtained, and thus the reliability of adjustment can be improved.

As explained above, the first automatic parts measuring/adjustment device can make adjustment, while measuring is being effected, with a plurality of contact pins automatically and simultaneously contacted with a larger-sized printed circuit board and with the driver device fitted in the to-be-adjusted component parts.

A control circuit for rotationally driving the driver device and adjusting an associated circuit will be explained in connection with the second automatic parts measuring/adjustment device.

Suppose, for example, that the deflection circuit of a color television receiver is desired to be adjusted. In this case, adjustment is needed based on the following relation. In order to enhance the efficiency of the circuits in the color TV receiver in a cry for a lower dissipation power and a saving in component parts, the color TV receiver is constructed based on a combination of the independence and interdependence of the functional circuits. The deflection circuit of the color TV receiver will be explained by way of example. When the output voltage value of the power supply circuit is varied by $\Delta e$ so as to obtain the regulation voltage the oscillators of a horizontal scanning circuit and vertical scanning circuit operated by voltage dependent upon the power supply voltage has their oscillation frequency varied by $\Delta f_1$ and $\Delta f_2$, respectively. Since the variation of the oscillation frequency of the horizontal oscillator simultaneously leads to a variation in duty ratio, the output voltage of a vertical output amplifier circuit which is operated by DC voltage obtained by rectifying the oscillator output pulse is also varied by $\Delta V$.

Where there is interdependence in the adjusting values between the functional circuits, adjustment is effected as follows.

① A power supply circuit is independently adjusted by connecting it to a dummy load which is equivalent in its load characteristic.

② The oscillators of the horizontal and vertical scanning circuits are operated by a reference power supply beforehand set at a regulation voltage and have this frequency adjusted.

③ The output of the vertical output amplifier circuit is adjusted by coordinately operating the deflection circuits.

The method for effecting adjustment in the order of ① - ③ is cumbersome in adjustment and involves added adjustment errors with respect to the adjusted values of the individual circuits, collectively introducing a greater adjustment error and sometimes requiring readjustment.

In order to solve such drawback the following method is adopted in a circuit to be set out below.

① The functional circuits to be adjusted are in such a state that they are simultaneously and coordinately operated.

② Adjustment is effected with respect to the circuits under this condition by parallely operating the corrsponding closed loops including a mechanical translation by the pulse motor.

Figure 25:
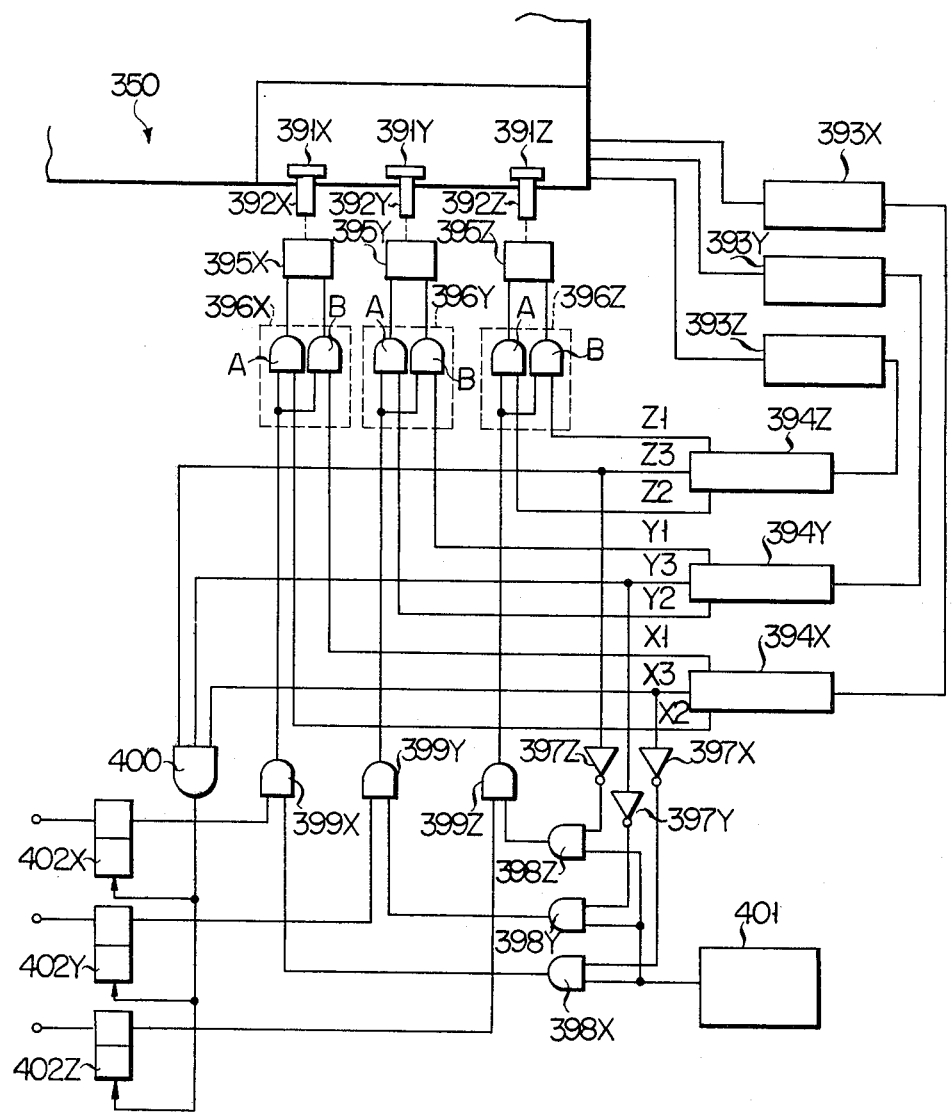
FIG. 25 is a circuit diagram showing one form of circuit as used in the electrical system of FIG. 22.

When all the circuits under adjustment simultaneously reach certain regulation values which are beforehand set, adjustment is completed. By so doing, automatic tracing is effected based on the interdependence between the above-mentioned functional circuits, leading to an improvement in the adjusting accuracy and in reduction of the adjusting time through paralled adjustment. In FIG. 25, 220 shows printed circuit board. The circuit board 220 is a larger-sized printed circuit board for a color TV receiver and coordinately includes a receiving system circuit and deflection system circuit.

The deflection system circuit includes, for example, a power supply circuit and output voltage adjustment circuit. A variable resistor or a variable reactance is included in a frequency adjustment circuit of horizontal and vertical scanning oscillators. A variable resistor is provided for adjusting a vertical output amplifier circuit. If one of the respective functional circuits is adjusted, the other circuits suffer an influence due to their interdependence.

In the location of the second automatic parts measuring/adjustment device the driver device is fitted into a desired to-be-adjusted component part on the printed circuit board 350. In the Figure, 391X shows a to-be-adjusted component part for horizontal oscillation adjustment, 391Y shows a to-be-adjusted component part for vertical amplitude adjustment, and 391Z shows a to-be-adjusted component part for power supply voltage adjustment. 392X, 392Y, 392Z show driver devices fitted into the respective component parts to be adjusted and adapted to be rotationally driven by pulse motors 395X, 395Y, 395Z.

The oscillation output delivered by the above-mentioned horizontal oscillation adjustment is inputted to a frequency counter 393X through the earlier-explained contact pin. Vertical amplitude voltage delivered by the vertical amplitude adjustment is inputted to a digital voltmeter 393Y. Power supply voltage outputted through the power supply voltage adjustment is inputted to a digital voltmeter 392Z.

The measured data of the above-mentioned frequency counters 393X, digital voltmeters 393Y, 393Z are inputted to digital comparators 394X, 394Y, 394Z. Predetermined data from a microcomputer are beforehand stored as reference data in the digital comparators 394X, 394Y, 394Z. The digital comparators 394X, 394Y, 394Z deliver the results of measuring i.e. data above regulating value range, data below the regulation value range and data within the regulation range. If in the respective digital comparators 394X, 394Y, 394Z the measured data is greater than the regulation value range, the output terminals X1, Y1, Z1 of these comparators produce logical outputs (high level). If the measured value is within the regulation value range, the output terminals X3, Y3, Z3 of the comparators produce logical outputs (high level). If the measured value is smaller than the regulation value range the output terminals X2, Y2, Z2 of the comparators produce logical outputs (high level).

The output terminals X1, X2 of the degital comparator 394X are connected to the corresponding input terminals of first and second AND circuits A and B in a rotation direction switching circuit of the pulse motor 395X. The output terminals Y1, Y2 of the digital comparator 394Y are connected to the corresponding input terminals of first and second AND circuit A, B in a rotation direction switching circuit 396Y of the pulse motor 395Y. The output terminals Z1 and Z2 of the digital comparator 394Z are connected to the corresponding input terminals of first and second AND circuits A, B in a rotation direction switching circuit 396Z of the pulse motor 395Z. The output terminals X3, Y3, Z3 of the respective digital comparators 394X, 394Y, 394Z are connected to first, second and third input terminals of an AND circuit 400. Respective rotation direction switching circuits, though not shown, include a motor drive circuit. The output terminals X3, Y3, Z3 of the digital comparators 394X, 394Y, 394Z are connected respectively through inverters 397X, 397Y, 397Z to the corresponding input terminals of AND circuits 398X, 398Y, 398Z. The output of a pulse generator circuit 401 is supplied commonly to the other terminal of the AND circuits 398X, 398Y, 398Z. The output terminals of the AND circuits 398X, 398Y, 398Z are connected to the corresponding input terminals of AND circuits 399X, 399Y, 399Z. The set output terminals of flip-flop circuits 402X, 402Y, 402Z are connected to the remaining terminals of the AND circuits 399X, 399Y, 399Z. The output terminal of the AND circuit 400 is connected to the reset terminal of the flip-flop circuits 402X, 402Y, 402Z. A control signal produced based on a signal for informing the completion of the gripping of the circuit board and starting of the measuring/adjustment operation is inputted into the set input terminals of the flip-flop circuits.

When the control signal for the start of adjustment is inputted to the flip-flop circuits 402X, 402Y, 402Z, set outputs are produced to cause the corresponding input terminals of the AND circuits 399X, 399Y, 399Z to become higher levels. The respective frequencies and voltages which are outputted through the adjustment of the component parts are inputted to the frequency counter 393X, digital voltmeters 393Y, 393Z for measurement. The measured data of the frequency counter 393X, digital voltmeters 393Y, 393Z are inputted to the digital comparators 394X, 394Y, 394Z for comparison with predetermined data. The respective digital comparators compare the measured data with the predetermined data and produce a high-level signal at its first output terminal side if the measured data is greater than the predetermined data and a high-level signal at its second output terminal side. This comparison operation is utilized for switching the rotation direction of the motor. The rotation direction switching circuit has its AND circuit A or B turned ON by the high-level signal from the first or second output terminal side of the digital comparator. The output pulse of the pulse generator circuit 401 is applied respectively through the AND circuits 398X, 398Y, 398Z and then through AND circuits 399X, 399Y, 399Z to the AND circuits A or B. In consequence, the respective motors 395X, 395Y, 395Z etc. are rotated in either direction to cause the driver devices to be driven for adjustment.

Now suppose that any one circuit is adjusted in the desired state, for example, the value of the digital voltmeter reaches a desired value. Then, the third output terminal Y3 of the digital comparator 394Y becomes a high level. For this reason, the AND circuit 398y is rendered nonconductive by the output of the inverter 397Y and no pulse from the pulse generator circuit 401 is applied to the motor 295Y, stopping the motor 395Y. When the third output terminal Y3 of the digital comparator 394 becomes a high level a high level signal is applied to the AND circuit 400. Since in this case the reamining input terminals of the AND circuit 400 are at the low level, no reset pulse is produced from the flip-flop circuit.

The above-mentioned adjustment is progressed with respect to the respective driver devices and the corresponding component parts and, when high level ouputs are obtained from the third output terminals X3, Y3, Z3 of the digital comparators 394X, 394Y, 394Z, a reset pulse to the flip-flop circuits 402X, 402Y, 402Z is obtained from the AND circuit 400. For this reason, signals applied from the flip-flop circuits 402X, 402Y, 402Z to the corresponding terminals of the AND circuits 399X, 399Y, 399Z become a low level. As a result, the AND circuits 399X, 399Y, 399Z are rendered nonconductive and the respective pulse motors are stopped because no pulse is applied to the respective motor. This means that adjustment is completed.

There sometimes occur the cases where the third output terminal of any one of the digital comparators 394X, 394Y, 394Z becomes a high level, while the first or second output terminal of the remaining comparators becomes a high level. This is, during the parallel adjustment over a plurality of objects to be adjusted there occurs the case where, for example, the vertical amplitude voltage becomes a regulation value, while the other horizontal oscillation frequency or power supply voltage needs adjustment. In this case, the first or second output terminal of the digital comparator 394X becomes a high level and the first or second output terminal of the digital comparator 394X becomes a high level. Therefore, the pulse motors 392X, 392Z corresponding to the digital comparators 394X, 394Z continue their rotation, or are switched for reverse rotation, so that adjustment is continued. Since in such an adjustment state the to-be-adjusted circuits are mutually dependent on each other, there occurs the case where while the power supply voltage becomes the regulation value the vertical amplitude is displaced. At this time, the third output terminal Z3 of the digital comparator 394Z becomes a high level and the first or second output terminal of the remaining digital comparators 394Y, 394X becomes a high level, causing the adjustment to be restarted or continued.

As mentioned above, the adjustment loops are rendered operative on the plurality of objects to be adjusted until all the outputs of the circuit to be adjusted reach the regulation values at the same time.

Figure 26:
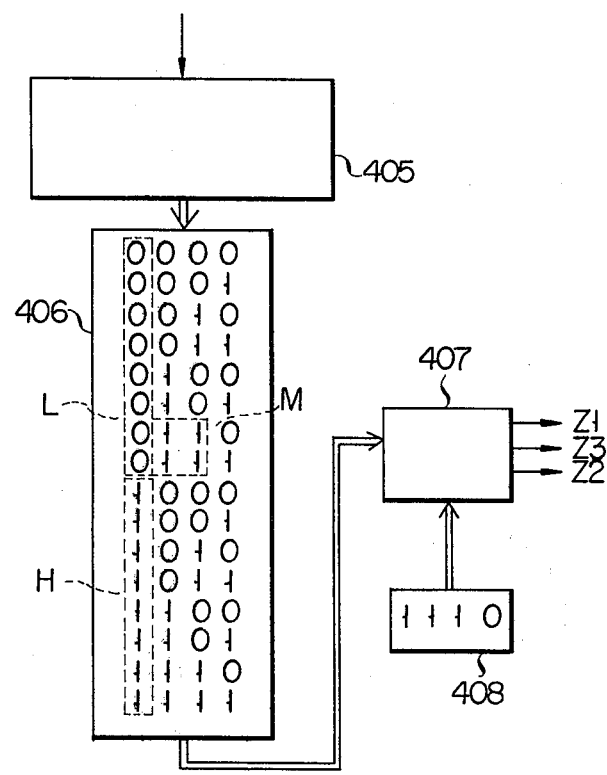
FIG. 26 is a block diagram showing one form of the interior of a digital comparator of the FIG. 25 circuit.
Figure 27:
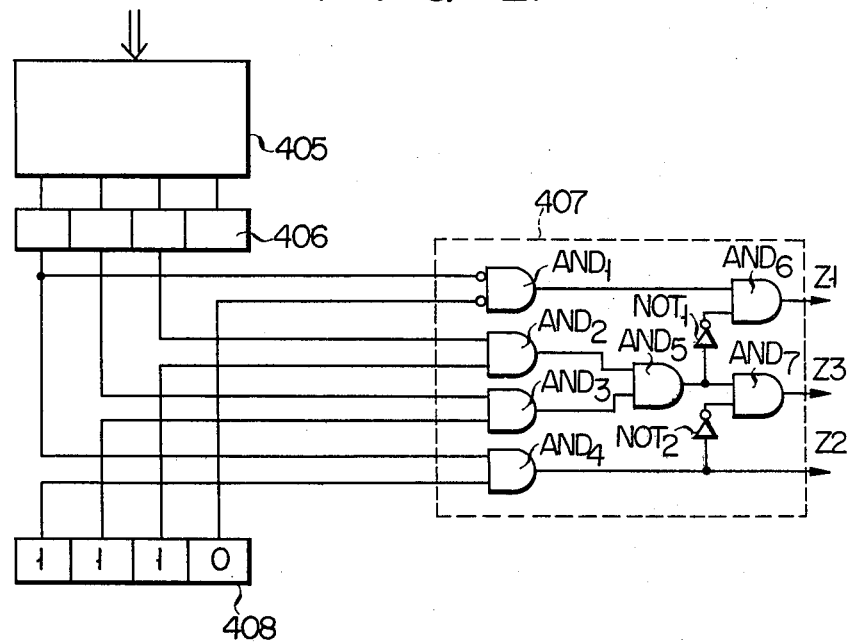
FIG. 27 is a circuit diagram showing the interior of a logical circuit of FIG. 26.

The digital comparator is theoretically constructed, for example, in FIGS. 26, 27. 405 shows a data converter circuit which, for example, decodes the measured data of the digital voltmeter 393Z into data of easily treatable digits. The output data of the data converter circuit 405 is inputted to, for example, a 4-bit latch circuit 406. The output of the latch circuit 406 is supplied to a logic circuit 407 where it is compared with data of a predetermined value data setting circuit 408. By so doing, judgement is made as to whether or not the input data is within the range of a predetermined value, greater than the predetermined value or smaller than the predetermined value and a judge output is delivered. If the most significant digit of the latch circuit 406 is "0", an input-negated AND circuit $AND_1$ as shown in FIG. 27 judges that the input data is smaller than the predetermined value. If the most significant digit of the latch circuit 406 is "1", an AND circuit $AND_4$ as shown in FIG. 27 judges that the input data is greater than the predetermined value. That is, if the most significant digit is as enclosed by the dotted line L, a high-level output is obtained from the AND circuit $AND_1$. If the most significant digit is as enclosed by the dotted line H, a high-level output is obtained from the $AND_4$. If the input data is as enclosed by the dotted line M, the input data is within a range of a predetermined value and high-level outputs can be obtained from the AND circuits $AND_2$, $AND_3$, $AND_5$. In FIG. 27 an inverter circuit $NOT_1$ and $AND_6$ are operated such that when the outputs of the AND circuits $AND_1$ and $AND_5$ are both at the high levels the priority order is determined. An inverter circuit $NOT_2$ and AND circuit $AND_7$ are operated such that when the outputs of the AND circuits $AND_4$, $AND_5$ are both at the high level the priority order is determined.

Figure 28:
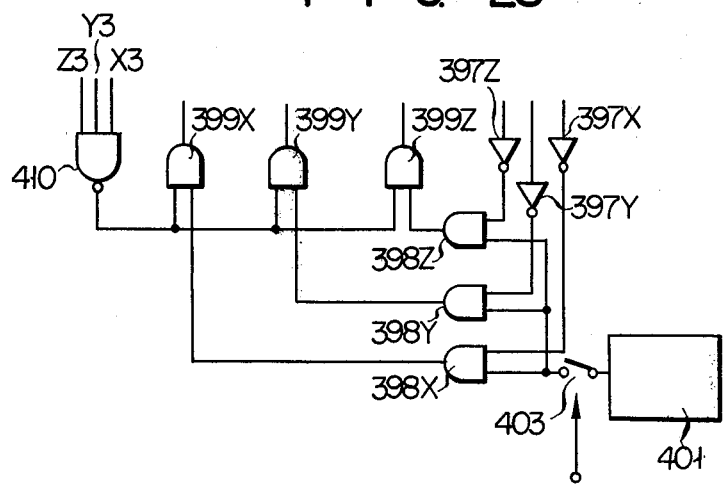
FIG. 28 is a circuit diagram showing one form of circuit of FIG. 25.

In the embodiment of FIG. 25 a means for taking a logical product of the predetermined logic outputs (high level) at the respective third outputs of the digital comparators 394X, 394Y, 394Z and utilizing this output may be taken in variety of forms. For example, AND circuits 399X, 399Y, 399Z may be gated by the output of an NAND circuit 410 as shown in FIG. 28. An adjustment start signal the output of the pulse start signal may be controlled by a switch circuit 403.

According to the above-mentioned circuit, with a plurality of closed loops simultaneously in operation the driving of the pulse motor is stopped when the adjustment value of the respective adjustment loops satisfies the set value of the digital comparator. Only when the set values of all the adjustment systems are satisfied with the adjustment loops closed, the adjustment loops are rendered OFF to permit simultaneous adjustment to be effected with respect to the plurality of objects.

The apparatus of this invention is particularly effective where the circuit adjustment is made in connection with its interdependent circuit components, permitting adjustment to be completed coordinately for a brief period of time. While in the above-mentioned embodiment the vertical amplitude, horizontal oscillation frequency and power supply voltage of, for example, the printed circuit board of the color TV reciever are adjusted, the circuit function can be applied not only to the color TV receiver, but also to an electric circuit requiring a plurality of adjustments. Where interdependence is involved, for example, as in the case of the adjustment of the FM frequency and of FM shift of a cassette type video tape recorder, the adjustment time can be reduced according to this invention, thus assuring improved efficiency. Although the simultaneous adjustment and trace adjustment are realized by a combination of flip-flop circuit and gate circuits in the embodiment of FIG. 25 the same logical arrangement can be realized through the utilization of a microcomputer etc. if the control system is in a digital fashion. In this case, the actual number of simultaneous adjustments can be efficiently increased.

INDUSTRIAL APPLICABILITY

The printed circuit board automatic testing apparatus of this invention exhibits its big effects in a factory where units with an electrical circuit on the printed circuit board are produced in greater quantity. The apparatus of this invention can be used not only in a factory where television receivers are produced, but also in a factory where the other devices such as computers and radios are produced.

We claim:

1. An automatic testing apparatus for automatically testing printed circuit boards, comprising a frame-like pallet (OR) for carrying a printed circuit board; a pallet supply device (OC) for supplying the pallet (OR) to a conveyor (OD) for testing process; a printed circuit board takeout device (OB) for placing the printed circuit board on the pallet (OR) which is supplied to the conveyor (OD); an automatic parts measuring/adjustment means (OI, OK) disposed in a fixed position on a travel path of the printed circuit board (OS) passed through an automatic parts testing apparatus (OF), said automatic parts testing apparatus being disposed on a path of conveyance of the printed circuit board (OS) by the conveyor (OD) and having upper and lower arm tables (20, 31) moved such that the printed circuit board (OS) is sandwiched therebetween, said lower arm table (31) having a contact pin (38) adapted to be contacted with each component part terminal etc. on the printed circuit board (OS), said automatic parts testing apparatus being capable of electrically detecting the respective component part through the contact pin (38), said automatic parts measuring/adjustment means (OI, OK) having upper and lower arm tables moved such that the printed circuit board carried at this position is sandwiched therebetween, said lower arm table (161) having a contact pin (168) adapted to be contacted with the corresponding terminal on the printed circuit board and said upper arm table having at least a driver device (158) adapted to be driven to permit it to be fitted into a to-be-adjusted component part on the printed circuit board, said automatic parts measuring/adjustment means being adapted to measure the circuit or component parts while adjusting the to-be-adjusted component part by said driver means (158); and sorting means (OG, OJ, OL) disposed in a fixed position on a path of conveyance of the printed circuit board (OS) by said conveyor means (OD) to lift the printed circuit board (OS) to permit it to be transferred to a conveyor (OH) for unfit circuit board if it is at least an unfit circuit board.

2. An automatic testing apparatus according to claim 1 in which said automatic parts measuring/adjustment means comprises a first automatic parts measuring/adjustment device (OI) adapted to adjust a receiving circuit block of a television circuit on the printed circuit board, and a second automatic parts measuring/adjustment device (OK) disposed in a fixed position on a path of conveyance of the printed circuit board (OS) to adjust a deflection circuit block of the television circuit on the printed circuit board (OS).

3. An automatic testing apparatus according to any one of claims 1 and 2, in which said sorting means comprises a first sorting device (OG) supported on a rail disposed above a path of conveyance of the printed circuit board and immediately after said automatic parts testing device (OF) such that it is located in a direction perpendicular to said path of conveyance, said first sorting device being movable by a motor over the conveyor for testing process and over the conveyor for unfit circuit board, a second sorting device (OJ) disposed on a path of conveyance of the printed circuit board (OS) and immediately after said first automatic parts measuring/adjustment device (OI) and constructed in the same way as said second sorting device, and a third sorting device (OL) supported by a rail disposed above a path of conveyance of the printed circuit board (OS) and immediately after said second automatic parts measuring/adjustment device (OK) such that it is located in a direction perpendicular to said path of conveyance, said third sorting device being movable by a motor over the conveyor (OD) at the middle of the rail, over the conveyor (OH) for unfit circuit board which is located at one end side of the rail, and over a guide device (ON) for fit circuit board which is located at the other end side of the rail.

* * * * *